United States Patent
Uemura et al.

(10) Patent No.: US 8,147,612 B2
(45) Date of Patent: Apr. 3, 2012

(54) METHOD FOR MANUFACTURING GALLIUM NITRIDE CRYSTAL AND GALLIUM NITRIDE WAFER

(75) Inventors: Tomoki Uemura, Itami (JP); Takashi Sakurada, Itami (JP); Shinsuke Fujiwara, Itami (JP); Takuji Okahisa, Itami (JP); Koji Uematsu, Itami (JP); Hideaki Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 305 days.

(21) Appl. No.: 12/298,332

(22) PCT Filed: Apr. 24, 2007

(86) PCT No.: PCT/JP2007/058843
§ 371 (c)(1),
(2), (4) Date: Feb. 10, 2009

(87) PCT Pub. No.: WO2007/125914
PCT Pub. Date: Nov. 8, 2007

(65) Prior Publication Data
US 2009/0194848 A1     Aug. 6, 2009

(30) Foreign Application Priority Data
Apr. 28, 2006   (JP) ................ P2006-126039

(51) Int. Cl.
*C30B 21/02* (2006.01)
(52) U.S. Cl. ............ 117/89; 117/90; 117/94; 117/96; 117/101; 117/103
(58) Field of Classification Search .......... 117/89, 117/90, 94, 96, 10, 103
See application file for complete search history.

(56) References Cited

U.S. PATENT DOCUMENTS

| | | | |
|---|---|---|---|
| 6,111,277 A | 8/2000 | Ikeda | |
| 2005/0076830 A1* | 4/2005 | Motoki et al. | ........... 117/92 |
| 2006/0038166 A1 | 2/2006 | Tsuda et al. | |

FOREIGN PATENT DOCUMENTS

| | | |
|---|---|---|
| CN | 1411035 | 4/2003 |
| EP | 1 296 362 | 3/2003 |
| JP | 11-126948 | 5/1999 |
| JP | 2001-160539 | 6/2001 |
| JP | 2002-33282 | 1/2002 |
| JP | 2002-359198 | 12/2002 |
| JP | 2003-124573 | 4/2003 |
| JP | 2003-165799 | 6/2003 |
| JP | 2003-183100 | 7/2003 |
| JP | 2004-59363 | 2/2004 |
| JP | 2004-221480 | 8/2004 |
| JP | 2004-262755 | 9/2004 |
| JP | 2006-66496 | 3/2006 |
| WO | WO 2005/041283 | 5/2005 |

* cited by examiner

*Primary Examiner* — Bob M Kunemund
(74) *Attorney, Agent, or Firm* — Drinker Biddle & Reath LLP

(57) ABSTRACT

There is provided a method for fabricating a gallium nitride crystal with low dislocation density, high crystallinity, and resistance to cracking during polishing of sliced pieces by growing the gallium nitride crystal using a gallium nitride substrate including dislocation-concentrated regions or inverted-polarity regions as a seed crystal substrate. Growing a gallium nitride crystal 79 at a growth temperature higher than 1,100° C. and equal to or lower than 1,300° C. so as to bury dislocation-concentrated regions or inverted-polarity regions 17a reduces dislocations inherited from the dislocation-concentrated regions or inverted regions 17a, thus preventing new dislocations from occurring over the dislocation-concentrated regions or inverted-polarity regions 17a. This also increases the crystallinity of the gallium nitride crystal 79 and its resistance to cracking during the polishing.

40 Claims, 12 Drawing Sheets

Fig.1
(A)
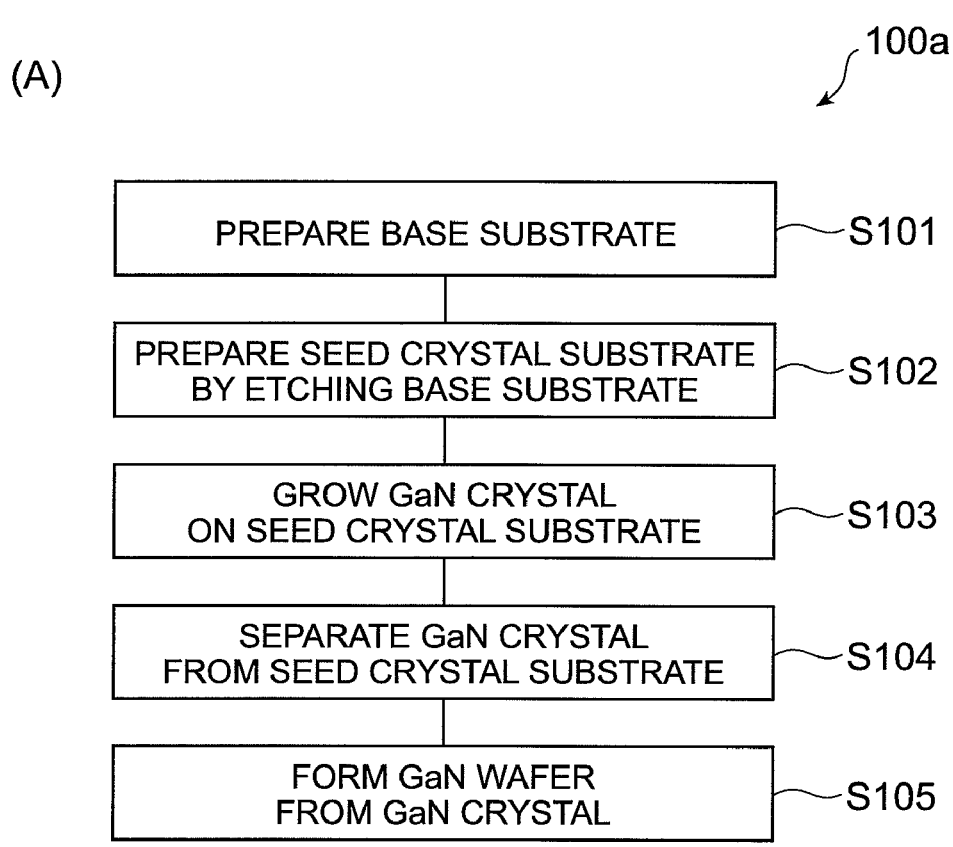
(B)
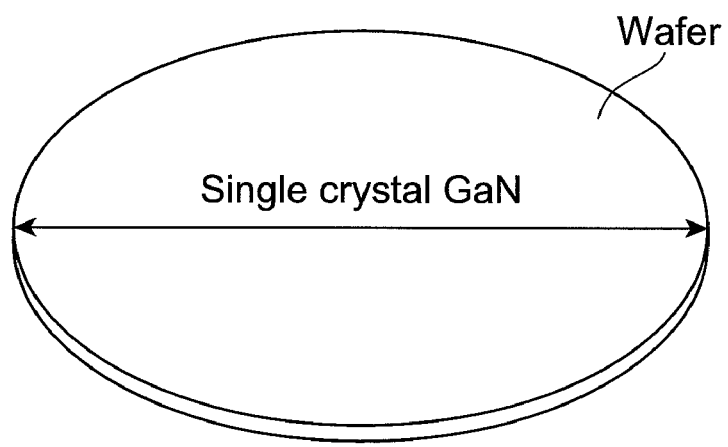

Fig.2
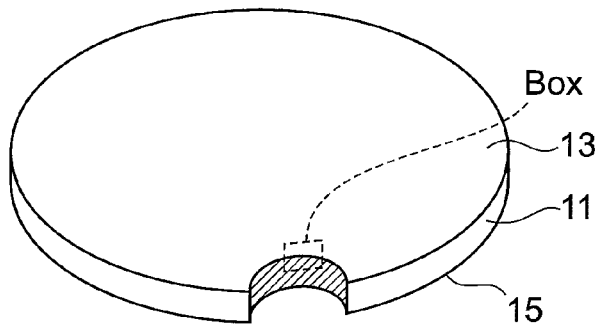
(A)
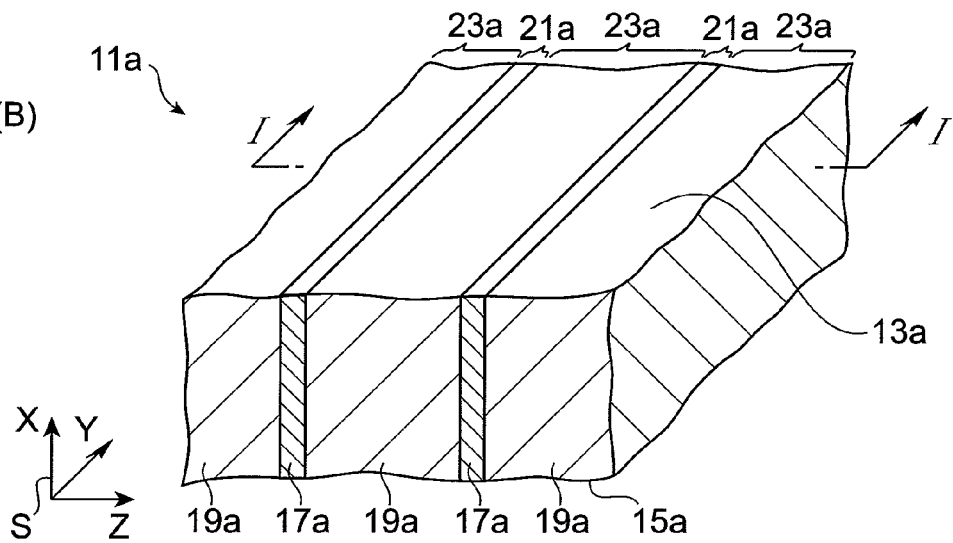
(B)
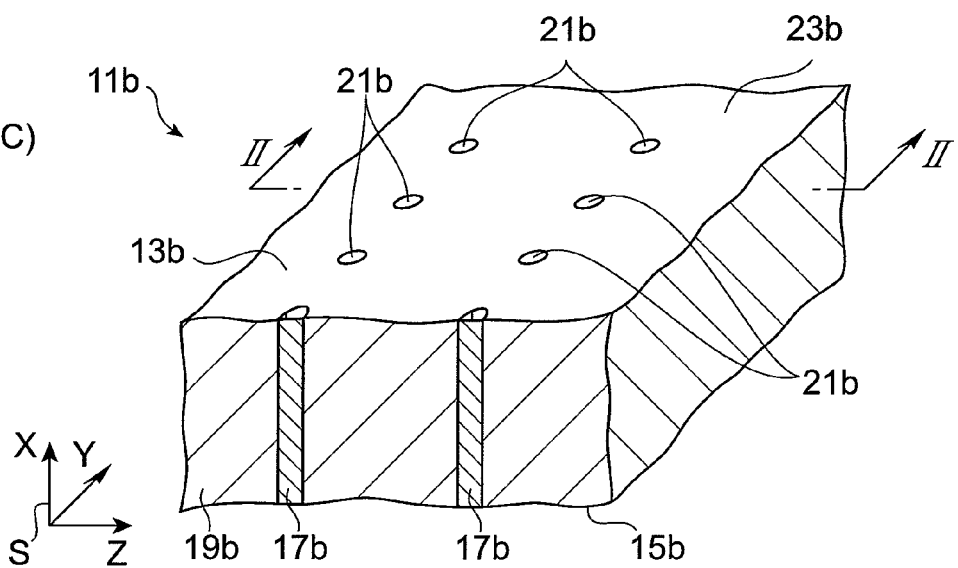
(C)

Fig.3
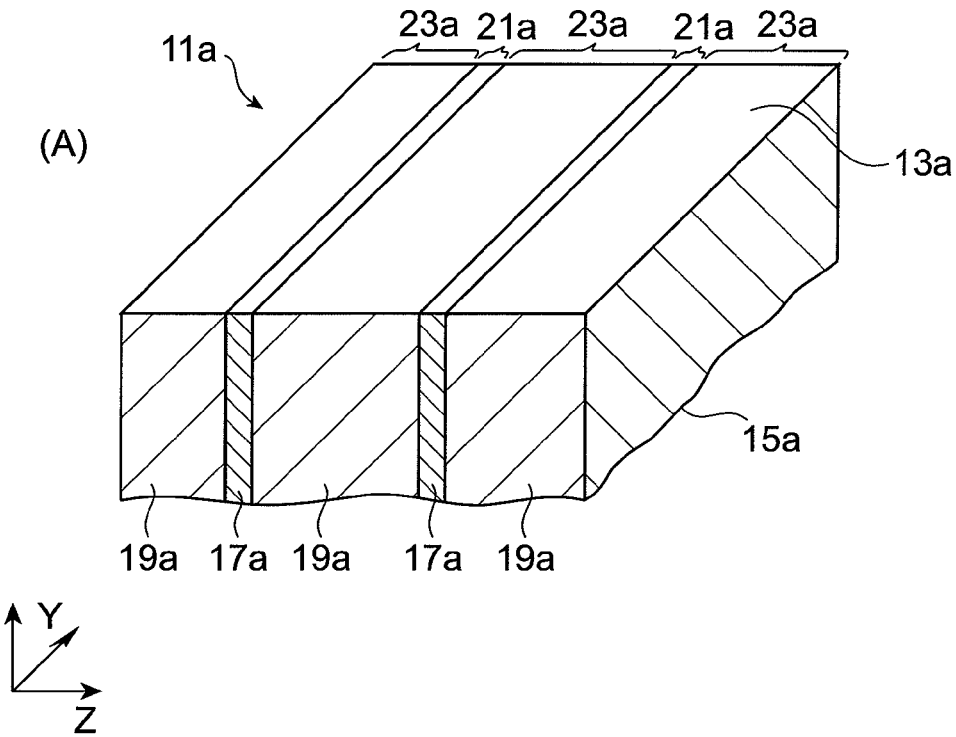
(A)
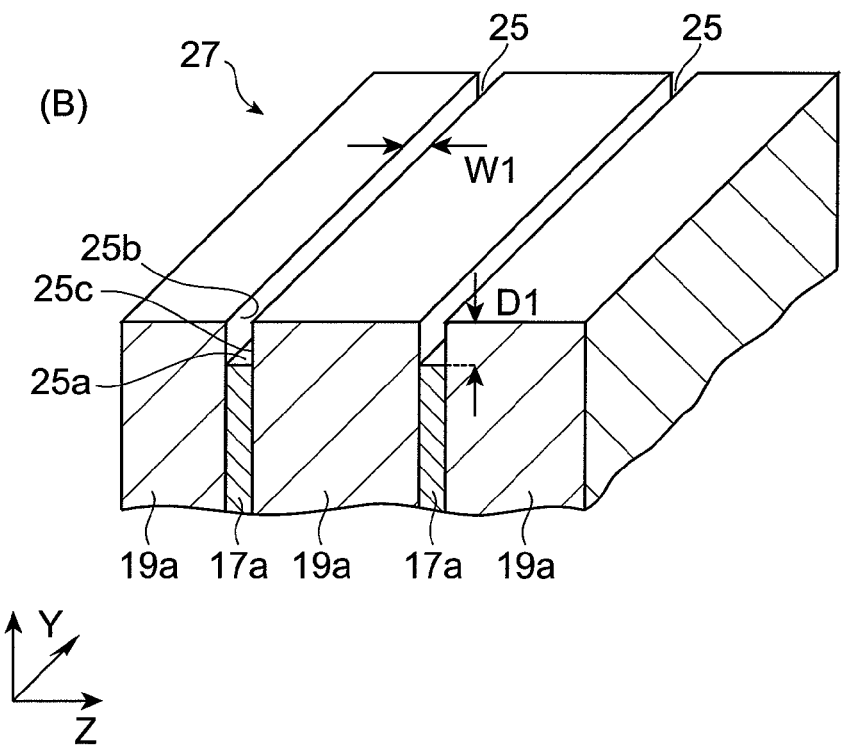
(B)

Fig.4
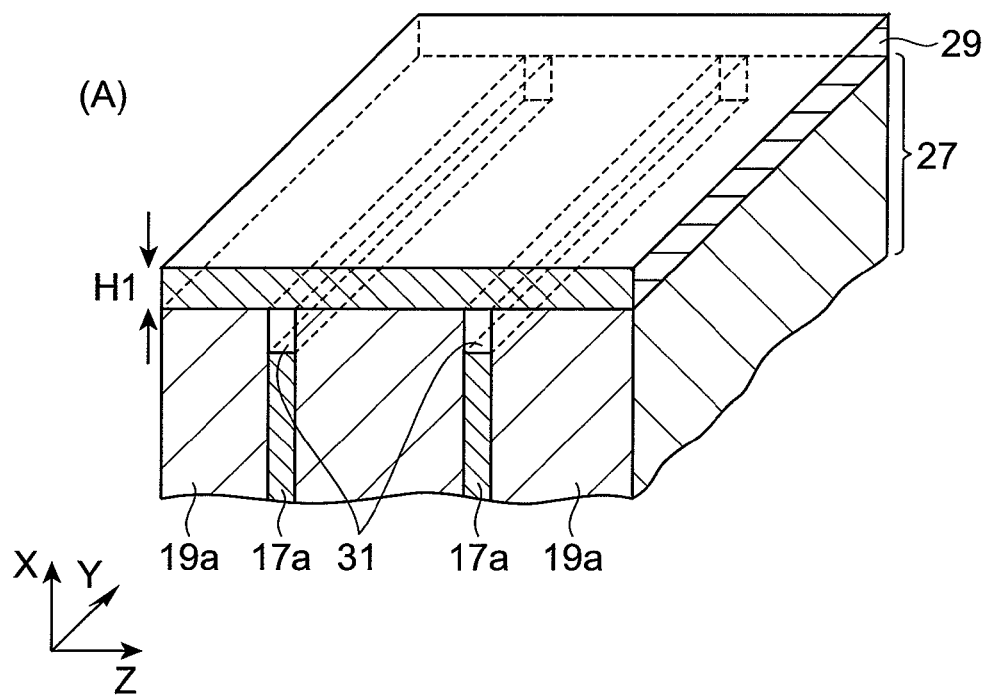
(A)
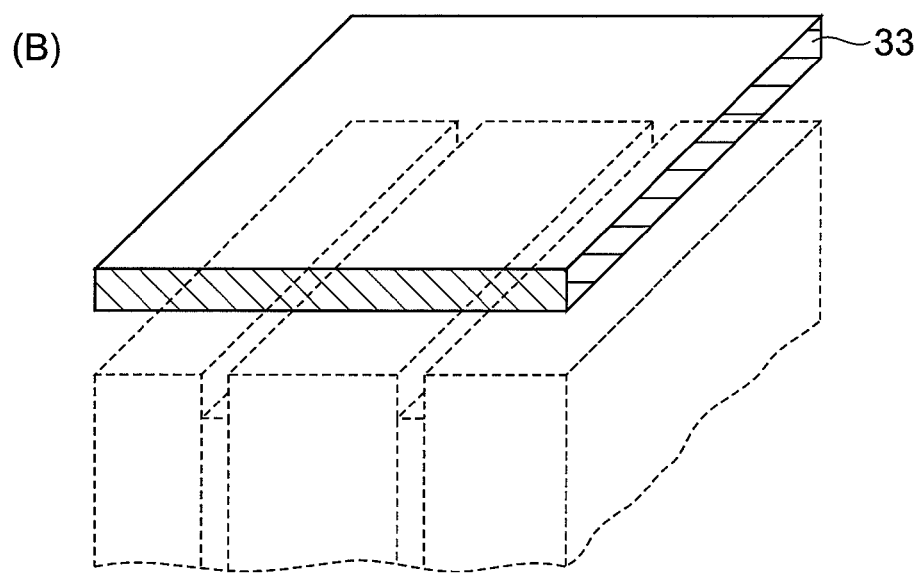
(B)

Fig.8
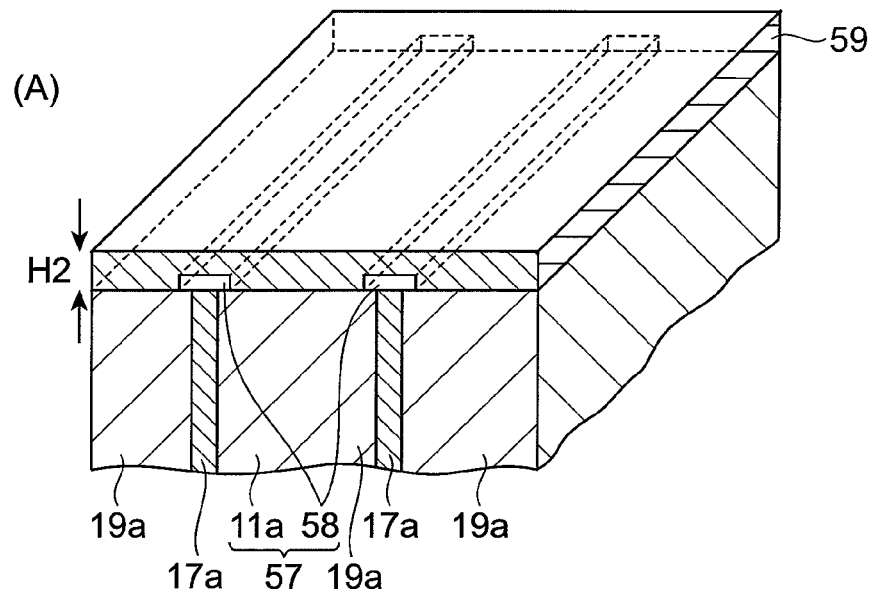
(A)
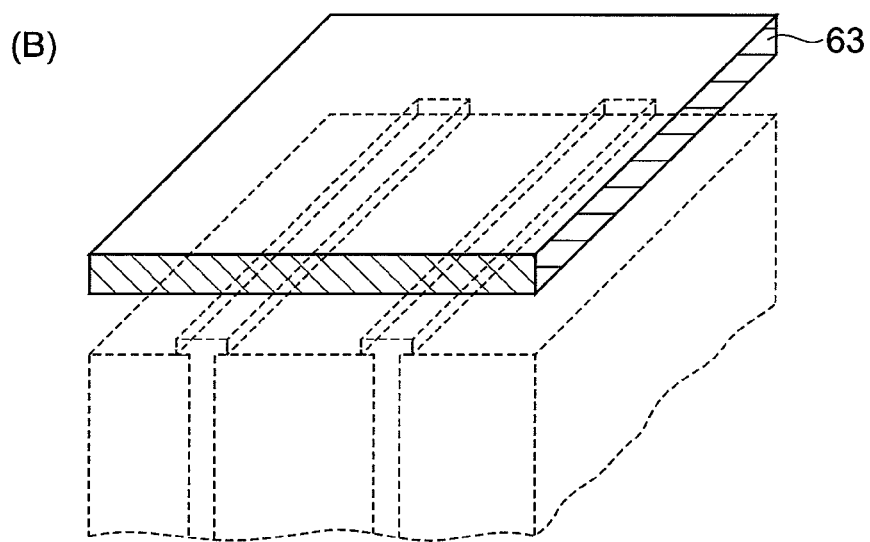
(B)

Fig.11
(A)
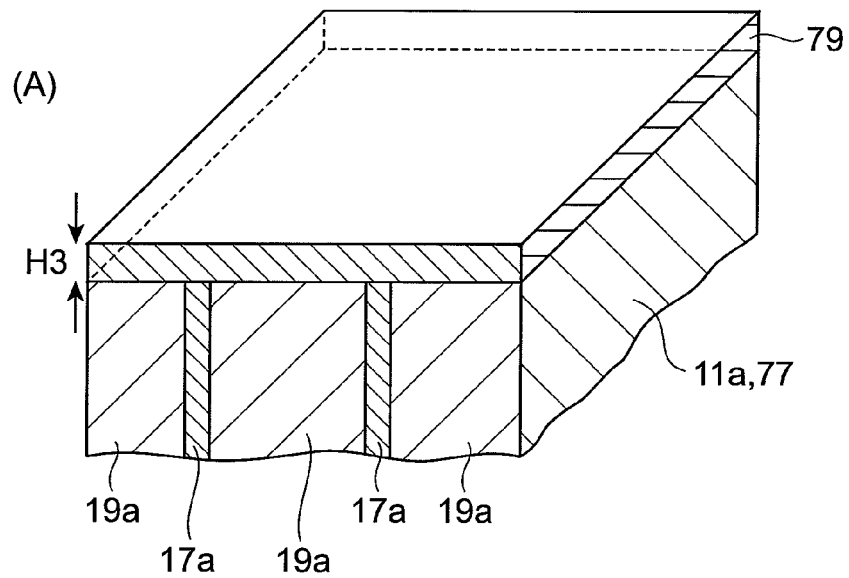
(B)
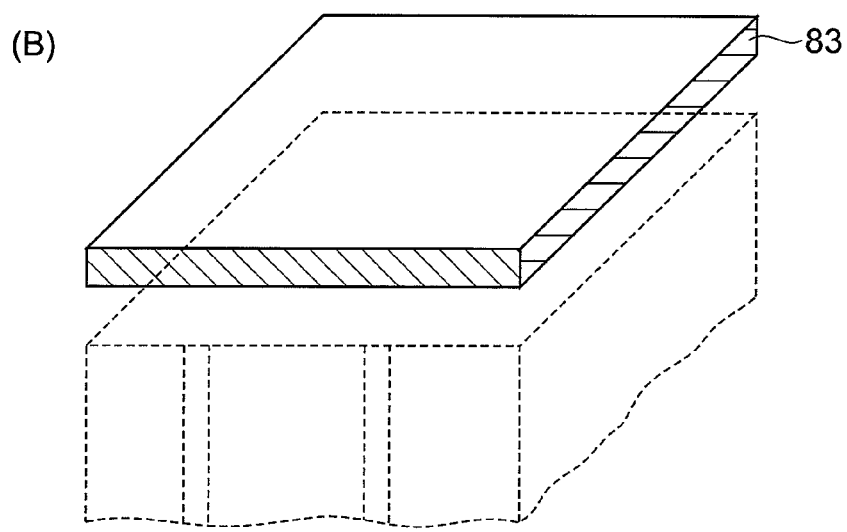

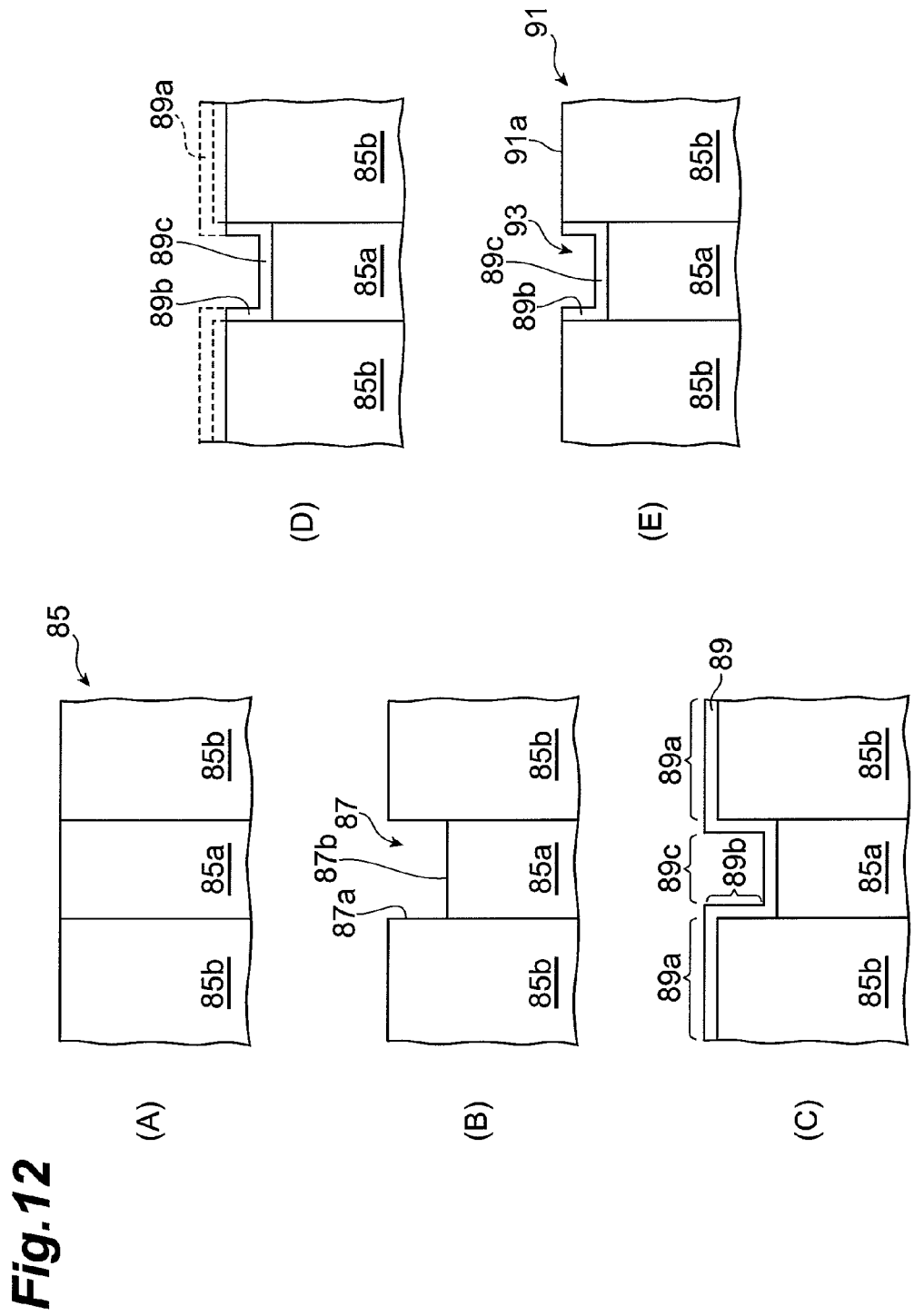

METHOD FOR MANUFACTURING GALLIUM NITRIDE CRYSTAL AND GALLIUM NITRIDE WAFER

TECHNICAL FIELD

The present invention relates to a method for fabricating a gallium nitride crystal, and also relates to a gallium nitride wafer.

BACKGROUND ART

Patent Document 1 describes a method for manufacturing a single-crystal gallium nitride crystal at a uniform epitaxial growth rate, and this crystal has good cleavage and low dislocation density. According to this method, after numerous isolated shielding portions are formed on a substrate of a different crystal, gallium nitride is grown by vapor-phase deposition into a sufficiently thick gallium nitride crystal with closed defect-concentrated regions H extending over the shielding portions. Subsequently, a free-standing gallium nitride frame substrate with a thickness of 100 to 500 μm is prepared by removing the back substrate and polishing the gallium nitride crystal or by cutting the crystal parallel to its surface. The closed defect-concentrated regions are then removed from the gallium nitride frame substrate by dry etching with hydrogen chloride gas, thus obtaining a gallium nitride skeletal substrate including only single-crystal low-dislocation-density accompanying regions and a single-crystal low-dislocation-density remaining region. A less-defect-concentrated gallium nitride crystal without closed defect-concentrated regions is manufactured by growing gallium nitride on the gallium nitride skeletal substrate by vapor-phase deposition.

Patent Document 2 describes a method for manufacturing a single-crystal substrate. According to this method, a crystal including both a portion with polarity A and a portion with polarity B is used. The portion with polarity B is completely or partially removed by etching to form a base, and a crystal is grown thereon again so that a crystal with polarity A is formed over the surface of the base or the entire single crystal with polarity A is formed thereon. Alternatively, the portion with polarity B is covered with a different material after being partially removed or not being removed, and the same crystal is grown again so that the surface is covered with a crystal with polarity A. The single-crystal substrate manufactured by this method has a surface of a single crystal with polarity A which is suitable for formation of an electronic device thereon.

Patent Document 3 describes a method for growing single-crystal gallium nitride and for manufacturing a single-crystal gallium nitride substrate. According to this method, a mask with a regularly striped pattern is provided on a base substrate, and linear V-grooves (troughs) defined by facets are formed thereover. Gallium nitride is facet-grown while the V-grooves are maintained so that defect-concentrated regions H are formed on the bottoms of the V-grooves (troughs) defined by the facets. Consequently, dislocations are concentrated to form the defect-concentrated regions H and therefore results in fewer dislocations in the surrounding regions, namely, low-dislocation-density single-crystal regions Z and c-plane growth regions Y. The defect-concentrated regions H trap and do not release the dislocations that have trapped because the regions H are closed. Facet growth, in which gallium nitride is grown while facets are formed and maintained, has a disadvantage of forming dislocations extending from the centers of pits defined by facets; they form planar defects extending radially. In addition, a device cannot be provided thereon because the positions where pits are formed cannot be controlled. These can be alleviated by the method described in Patent Document 3.

Patent Document 4 describes a method for growing single-crystal gallium nitride and for fabricating single-crystal gallium nitride. According to this method, a regular seed pattern is provided on a base substrate, and gallium nitride is facet-grown thereon while pits defined by facets are formed and maintained so that closed defect-concentrated regions H are formed on the bottoms of the pits defined by the facets. As a result, dislocations are concentrated to form the defect-concentrated regions H, while the dislocation density of the surrounding regions, namely, single-crystal low-dislocation-density accompanying regions Z and a single-crystal low-dislocation-density remaining region Y, is reduced. The closed defect-concentrated regions H trap and do not release the dislocations because the regions H are closed.

Patent Document 1: Japanese Unexamined Patent Application Publication No. 2004-59363
Patent Document 2: Japanese Unexamined Patent Application Publication No. 2004-221480
Patent Document 3: Japanese Unexamined Patent Application Publication No. 2003-183100
Patent Document 4: Japanese Unexamined Patent Application Publication No. 2003-165799

DISCLOSURE OF INVENTION

Problems to be Solved by the Invention

A gallium nitride crystal has attracted attention as a material for semiconductor devices, such as short-wavelength semiconductor optical devices and power electronic devices, because it has a bandgap energy of 3.4 eV ($5.4 \times 10^{-19}$ J) and high thermal conductivity. One important quality of materials for semiconductor devices is to contain fewer crystal dislocations. To achieve this quality, the development of low-dislocation-density gallium nitride crystals and their substrates has been pushed forward.

In Patent Documents 3 and 4, for example, a gallium nitride crystal is grown such that dislocations concentrate in parts of the crystal, thus fabricating a partially low-dislocation-density gallium nitride crystal. Substrates manufactured by the methods described in Patent Documents 3 and 4 include dislocation-concentrated regions or inverted regions. In Patent Documents 1 and 2, on the other hand, a gallium nitride crystal is grown on a gallium nitride crystal wafer described in Patent Document 3 or 4, used as a seed crystal substrate so as to embed dislocation-concentrated regions or inverted regions, in order to prevent these regions from affecting the gallium nitride crystal being grown. The gallium nitride crystal manufactured by this method has a dislocation density of about $1 \times 10^6$ cm$^{-2}$.

If, however, a gallium nitride crystal is grown on a seed crystal substrate composed of a crystal including dislocation-concentrated regions or inverted polarity regions, as described in Patent Documents 1 and 2, new dislocations may occur from sites where the dislocation-concentrated regions or inverted polarity regions are embedded. The grown gallium nitride crystal also has variations in crystallinity due to variations in the crystallinity of the dislocation-concentrated regions or inverted polarity regions of the seed crystal substrate, and these variations are not negligible in some cases. Furthermore, when the grown gallium nitride crystal is sliced and polished to prepare a gallium nitride substrate, it may be cracked during the polishing. This may preclude reliable production of gallium nitride substrates.

An object of the present invention, which has been made in light of the above circumstances, is to provide a method for fabricating a gallium nitride crystal with low dislocation density, high crystallinity, and resistance to cracking during polishing after slicing by growing the gallium nitride crystal on a seed crystal substrate including dislocation-concentrated regions or inverted regions, and also to provide a gallium nitride wafer.

Means for Solving the Problems

An aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming recesses in the first areas to prepare a seed crystal substrate; and (c) growing a gallium nitride crystal on the seed crystal substrate by vapor-phase deposition such that voids corresponding to the recesses are formed.

According to this method, the gallium nitride crystal is grown on the seed crystal substrate by vapor-phase deposition such that the voids corresponding to the recesses are formed while the gallium nitride crystal is integrally grown on the second region. The gallium nitride crystal is therefore grown not in the first areas but in the second area on the seed crystal substrate. Accordingly, the gallium nitride crystal has a lower dislocation density because gallium nitride crystal inheriting dislocations from the first regions is not formed.

An aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming recesses in the first areas to prepare a seed crystal substrate; and (c) growing a gallium nitride crystal on the seed crystal substrate by liquid-phase deposition such that voids corresponding to the recesses are formed.

According to this method, the gallium nitride crystal is grown on the seed crystal substrate by liquid-phase deposition such that the voids corresponding to the recesses are formed while the gallium nitride crystal is integrally grown on the second region. The gallium nitride crystal is therefore grown not in the first areas but in the second area on the seed crystal substrate. Accordingly, the gallium nitride crystal has a lower dislocation density because gallium nitride crystal inheriting dislocations from the first regions is not formed.

An aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) preparing a seed crystal substrate by forming recesses in the first areas; and (c) growing a gallium nitride crystal on the seed crystal substrate by vapor-phase deposition at a growth temperature higher than 1,100° C. and equal to or lower than 1,300° C.

According to this method, the gallium nitride crystal is grown on the seed crystal substrate by vapor-phase deposition such that the voids corresponding to the recesses are formed while the gallium nitride crystal is integrally grown on the second region. The gallium nitride crystal is therefore grown not in the first areas but in the second area on the seed crystal substrate. Accordingly, the gallium nitride crystal has a lower dislocation density because no gallium nitride crystal inheriting dislocations from the first regions is formed. In addition, growing the gallium nitride crystal on the seed crystal substrate at a growth temperature higher than 1,100° C. reduces new dislocations occurring when the gallium nitride crystal grown in the second area is integrally grown over the recesses and also reduces the full width at half maximum of an XRD (004) rocking curve. Another advantage is that the grown gallium nitride crystal can be prevented from being cracked during polishing after slicing, thus improving the yield after the polishing. Although it is unclear how cracking is prevented during the polishing, it is assumed that a growth temperature higher than 1,100° C. will reduce stress-concentrated sites in the gallium nitride crystal. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. Accordingly, extraordinarily high growth temperatures are undesirable, and the growth temperature is preferably equal to or lower than 1,300° C.

In the method according to the present invention, the growth temperature is preferably higher than 1,150° C. In addition, the growth temperature is preferably equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked in the polishing of the sliced piece after slicing more effectively, thus further improving the yield in the polishing. At a growth temperature exceeding 1,250° C., however, the seed crystal substrate decomposes to some extent, though not so significantly, even though the temperature does not exceed 1,300° C. This precludes growth to form a thick film for a long time and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 µm or less in terms of arithmetic average roughness Ra. This invention can prevent cracking of the gallium nitride crystal during the growth, so that the gallium nitride crystal can be reliably grown. It avoids local stresses due to surface irregularities of the seed crystal substrate.

In the methods according to the present invention, the second area of the seed crystal substrate more preferably has a surface roughness of 1 µm or less in terms of arithmetic average roughness Ra. This invention can prevent cracking of the gallium nitride crystal during the growth more effectively, so that the gallium nitride crystal can be more reliably grown.

In the methods according to the present invention, the first regions are composed of single-crystal gallium nitride, the second region is composed of single-crystal gallium nitride, and the crystal axis of the single-crystal gallium nitride in the first regions is opposite in orientation to that of the single-crystal gallium nitride in the second region.

According to this method, a gallium nitride crystal having a crystal axis corresponding to that of the single-crystal gallium nitride in the second region is grown on the seed crystal substrate.

In the methods according to the present invention, the N-plane of the single-crystal gallium nitride can appear on the first areas, the recesses can be formed by etching the primary surface of the gallium nitride substrate in the step of forming the recesses in the first areas to prepare the seed crystal substrate, and the etching can be performed with at least one of $HCl$, $Cl_2$, $BCl_3$, and $CCl_4$.

This method allows selective dry etching of the single-crystal gallium nitride in the first areas to prepare the seed crystal substrate because the crystal axis of the single-crystal gallium nitride in the first regions is opposite in orientation to that of the single-crystal gallium nitride in the second region. Through the dry etching, the recesses are formed in the primary surface of the gallium nitride substrate.

In the methods according to the present invention, the N-plane of the single-crystal gallium nitride appears on the first areas, the recesses are formed by etching the primary surface of the gallium nitride substrate in the step of forming the recesses in the first areas to prepare the seed crystal substrate, and the etching is performed with a solution containing at least one of phosphoric acid, nitric acid, and sulfuric acid.

This method allows selective wet etching of the single-crystal gallium nitride in the first areas with the solution containing at least one of phosphoric acid, nitric acid, and sulfuric acid to prepare the seed crystal substrate because the crystal axis of the single-crystal gallium nitride in the first regions is opposite in orientation to that of the single-crystal gallium nitride in the second region. Through the wet etching, the recesses are formed in the primary surface of the gallium nitride substrate.

In the methods according to the present invention, the N-plane of the single-crystal gallium nitride appears on the first areas, the recesses are formed by etching the primary surface of the gallium nitride substrate in the step of forming the recesses in the first areas to prepare the seed crystal substrate, and the etching is performed with a solution containing potassium hydroxide.

This method allows selective wet etching of the single-crystal gallium nitride in the first areas with the solution containing potassium hydroxide to prepare the seed crystal substrate because the crystal axis of the single-crystal gallium nitride in the first regions is opposite in orientation to that of the single-crystal gallium nitride in the second region. Through the wet etching, the recesses are formed in the primary surface of the gallium nitride substrate.

In the methods according to the present invention, alternatively, the etching can be performed with a solution containing sodium hydroxide. Also, the etching can be performed with a solution containing at least one of potassium hydroxide and sodium hydroxide. These etchants allow selective wet etching of the single-crystal gallium nitride in the first areas, whereby the seed crystal substrate can be prepared.

In the methods according to the present invention, alternatively, the etching can be performed with a melt containing potassium hydroxide, or can be performed with a melt containing sodium hydroxide. Also, the etching can be performed with a melt containing at least one of potassium hydroxide and sodium hydroxide. These melts can be used to perform desired etching within a shorter period of time than that required for their solutions.

Another aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming a mask over the first areas to prepare a seed crystal substrate; and (c) growing gallium nitride on the gallium nitride of the seed crystal substrate by vapor-phase deposition to embed the mask.

According to this method, the mask is embedded under the gallium nitride crystal by selectively growing the gallium nitride crystal in the second area on the seed crystal substrate by vapor-phase deposition, so that the gallium nitride crystal is integrally grown on the second region. Accordingly, the gallium nitride crystal has a lower dislocation density because no gallium nitride crystal inheriting dislocations from the first regions is formed.

Another aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming a mask over the first areas to prepare a seed crystal substrate; and (c) growing gallium nitride on the gallium nitride of the seed crystal substrate by liquid-phase deposition so as to embed the mask.

According to this method, the mask is embedded under the gallium nitride crystal by selectively growing the gallium nitride crystal in the second area on the seed crystal substrate by liquid-phase deposition, so that the gallium nitride crystal is integrally grown on the second region. Accordingly, the gallium nitride crystal has a lower dislocation density because no gallium nitride crystal inheriting dislocations from the first regions is formed.

Another aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) preparing a seed crystal substrate by forming a mask so as to cover the first areas; and (c) growing a gallium nitride crystal on the seed crystal substrate by vapor-phase deposition at a growth temperature higher than 1,100° C. and equal to or lower than 1,300° C. to form a gallium nitride crystal thicker than the mask.

According to this method, the mask is embedded under the gallium nitride crystal by selectively growing the gallium nitride crystal in the second area on the seed crystal substrate by vapor-phase deposition, so that the gallium nitride crystal is integrally grown on the second region. Accordingly, the gallium nitride crystal has a lower dislocation density because gallium nitride crystal not inheriting dislocations from the first regions is formed. In addition, growing the gallium nitride crystal on the seed crystal substrate at a growth temperature higher than 1,100° C. reduces new dislocations occurring when the gallium nitride crystal grown in the second area is integrally grown over the mask and also reduces the full width at half maximum of an XRD (004) rocking curve. Another advantage is that the grown gallium nitride crystal can be prevented from being cracked during polishing after slicing, thus improving the yield after the polishing. A growth temperature higher than 1,100° C. reduces stress-concentrated sites in the gallium nitride crystal to prevent the clacking during the polishing. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is, however, that the decomposition rate of the gallium nitride crystal that has been formed increases more significantly than the formation rate of the gallium nitride crystal at extraordinarily high growth temperatures, thus decreasing the growth rate corresponding to the difference between the formation rate and the decomposition rate. Accordingly, extraordinarily high growth temperatures are undesirable, and the growth temperature is preferably equal to or lower than 1,300° C.

In the method according to the present invention, the growth temperature is preferably higher than 1,150° C. and equal to or lower than 1,250° C.

According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of sliced pieces effectively, thus further improving the yield after the polishing. At a growth temperature exceeding 1,250° C., however, the seed crystal substrate decomposes to some extent, though not so significantly, even though the temperature does not exceed 1,300° C. This precludes growth to form a thick film for a long time and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 μm or less in terms of arithmetic average roughness Ra. According to this invention, the gallium nitride crystal is not cracked during the growth. Although the reason is unclear, it may avoid local stresses due to surface irregularities of the seed crystal substrate.

In the methods according to the present invention, the second area of the seed crystal substrate more preferably has a surface roughness of 1 μm or less in terms of arithmetic average roughness Ra. This invention can prevent cracking of the gallium nitride crystal during the growth more effectively, so that the gallium nitride crystal can be more reliably grown.

In the methods according to the present invention, the mask is preferably composed of at least one of silicon oxide and silicon nitride.

If the mask is composed of such a material, no gallium nitride crystal grows thereon, and a high-quality gallium nitride crystal growing on the second region grows in the lateral direction, finally forming integrated gallium nitride.

In the methods according to the present invention, each first region has a stripe shape, and the second region is provided between the first regions. In the methods according to the present invention, alternatively, the first regions are arranged in an array, and the first regions are separated from each other by the second region.

A still another aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming recesses in the first areas and a mask over the recesses in the first areas to prepare a seed crystal substrate; and (c) growing a gallium nitride crystal on the seed crystal substrate by liquid-phase deposition or vapor-phase deposition such that voids corresponding to the recesses are formed.

According to this method, the mask is formed over the recesses in the first areas on the seed crystal substrate, and the gallium nitride crystal is grown on the seed crystal substrate such that the voids are formed. The gallium nitride crystal is therefore integrally grown on the second region. Accordingly, the gallium nitride crystal has a lower dislocation density because gallium nitride crystal not inheriting dislocations from the first regions is formed.

A still another aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; (b) forming recesses in the first areas and a mask over the recesses in the first areas to prepare a seed crystal substrate, the recesses being covered with the mask; and (c) growing a gallium nitride crystal on the seed crystal substrate by vapor-phase deposition at a growth temperature higher than 1,100° C. and equal to or lower than 1,300° C.

According to this method, the mask is formed over the recesses in the first areas on the seed crystal substrate, and the gallium nitride crystal is grown on the seed crystal substrate such that the voids are formed. The gallium nitride crystal is therefore integrally grown on the second region. Accordingly, the gallium nitride crystal has a lower dislocation density because gallium nitride crystal not inheriting dislocations from the first regions is formed. In addition, growing the gallium nitride crystal on the seed crystal substrate at a growth temperature higher than 1,100° C. reduces new dislocations occurring when the gallium nitride crystal grown in the second area is integrally grown over the mask and also reduces the full width at half maximum of an XRD (004) rocking curve. Another advantage is that the grown gallium nitride crystal can be prevented from being cracked during polishing of sliced pieces, thus improving the yield after the polishing. A growth temperature higher than 1,100° C. can reduces stress-concentrated sites in the gallium nitride crystal to prevent cracking during the polishing. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. Accordingly, extraordinarily high growth temperatures are undesirable, and the growth temperature is preferably equal to or lower than 1,300° C.

With the seed crystal substrate prepared by forming both the recesses and the mask in the first areas, gallium nitride crystal not inheriting the first areas is grown even under such growth conditions that the growth rate reaches 200 µm/h or more. In contrast, the first areas can affect the growth of a gallium nitride crystal on the following seed crystal substrate under such growth conditions that the growth rate reaches 200 µm/h or more: a seed crystal substrate prepared by forming the recesses in the first areas; a seed crystal substrate prepared by forming the mask in the first areas; and a seed crystal substrate prepared without forming the recesses or the mask in the first areas. Hence, the growth of the gallium nitride crystal on the seed crystal substrate having both the recesses and the mask has a cost advantage over the growth on the other seed crystal substrates.

In the method according to the present invention, the growth temperature is preferably higher than 1,150° C. and equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of sliced pieces more effectively, thus further improving the yield of the polishing. At a growth temperature exceeding 1,250° C., however, the seed crystal substrate decomposes to some extent, though not so significantly, even though the temperature does not exceed 1,300° C. This precludes extended growth to form a thick film for a long time and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 µm or less in terms of arithmetic average roughness Ra. According to this invention, the gallium nitride crystal is not cracked during the growth. It avoids local stresses due to surface irregularities of the seed crystal substrate.

In the methods according to the present invention, the second area of the seed crystal substrate preferably has a surface roughness of 1 µm or less in terms of arithmetic average roughness Ra. This invention can prevent cracking of the gallium nitride crystal during the growth more effectively, so that the gallium nitride crystal can be more reliably grown.

In the methods according to the present invention, the first regions can be composed of single-crystal gallium nitride, the second region can be composed of single-crystal gallium nitride, and the crystal axis of the single-crystal gallium nitride in the first regions can be opposite in orientation to that of the single-crystal gallium nitride in the second region.

In the methods according to the present invention, preferably, the N-plane of the single-crystal gallium nitride appears on the first areas, the recesses are formed by etching the primary surface of the gallium nitride substrate in the step of preparing the seed crystal substrate by forming the recesses in the first areas and forming the mask so as to cover the recesses in the first areas, and the etching is performed with at least one of HCl, $Cl_2$, $BCl_3$, and $CCl_4$. In the methods according to the present invention, preferably, the N-plane of the single-crystal gallium nitride appears on the first areas, the recesses are formed by etching the primary surface of the gallium nitride substrate in the step of forming the recesses in the first areas and the mask over the recesses in the first areas to prepare the seed crystal substrate, and the etching is performed with a solution containing at least one of phosphoric acid, nitric acid, and sulfuric acid. In the methods according to the present invention, preferably, the N-plane of the single-crystal gallium nitride appears on the first areas, the recesses are formed by etching the primary surface of the gallium nitride substrate in the step of forming the recesses in the first areas and the mask over the recesses in the first areas to prepare the seed crystal substrate, and the etching is performed with a solution containing at least one of potassium hydroxide and sodium hydroxide. In the methods according to the present invention, the N-plane of the single-crystal gallium nitride appears on the first areas, the recesses are formed by etching the primary surface of the gallium nitride substrate in the step of preparing the seed crystal substrate by forming the recesses in the first areas and forming the mask so as to cover the recesses in the first areas, and the etching is performed with a melt containing at least one of potassium hydroxide and sodium hydroxide. With such solutions and melts, the N-plane can be selectively etched.

In the methods according to the present invention, the mask is preferably composed of at least one of silicon oxide and silicon nitride. If the mask is composed of such a material, gallium nitride crystal does not grow thereon, and high-quality gallium nitride growing on the second region grows in the lateral direction, finally forming integrated gallium nitride.

A further aspect of the present invention is a method for fabricating a gallium nitride crystal. This method includes the steps of (a) preparing a gallium nitride substrate including a plurality of first regions having a dislocation density higher than a first dislocation density, a second region having a dislocation density lower than the first dislocation density, and a primary surface including first areas where the first regions appear and a second area where the second region appears; and (b) growing a gallium nitride crystal using the gallium nitride substrate as a seed crystal substrate by vapor-phase deposition at a growth temperature higher than 1,100° C. and equal to or lower than 1,300° C., neither recesses nor a mask being formed in the first areas.

According to this method, a growth temperature higher than 1,100° C. facilitates lateral growth of the gallium nitride crystal on the seed crystal substrate to reduce the proportion of dislocations inherited from the first regions and also reduces new dislocations occurring when the gallium nitride crystal is integrally grown in the transverse direction. In addition, this method can omit a surface-processing step for forming recesses or a mask on the seed crystal substrate because they are not required, and can prevent new dislocations from occurring due to surface irregularities on the seed crystal substrate. Accordingly, the grown gallium nitride crystal can have a still lower dislocation density. In addition, the full width at half maximum of an XRD (004) rocking curve can be reduced. Another advantage is that the grown gallium nitride crystal can be prevented from being cracked during polishing after slicing, thus improving the yield after the polishing. A growth temperature higher than 1,100° C. will reduce stress-concentrated sites in the gallium nitride crystal to prevent the cracking during the polishing. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. Accordingly, extraordinarily high growth temperatures are undesirable, and the growth temperature is preferably equal to or lower than 1,300° C.

In the method according to the present invention, the growth temperature is preferably higher than 1,150° C. In addition, the growth temperature is preferably equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of slicing more effectively, thus further improving the yield in the polishing. At a growth temperature exceeding 1,250° C., however, the seed crystal substrate decomposes to some extent, though not so significantly, even though the temperature does not exceed 1,300° C. This precludes growth to form a thick film for a long time, and limits the growth rate of the gallium nitride crystal to a certain level, resulting in cost disadvantage. Accordingly, the growth temperature is more preferably equal to or lower than 1,250° C.

In the method according to the present invention, the second area of the seed crystal substrate preferably has a surface roughness of 10 μm or less in terms of arithmetic average roughness Ra. According to this invention, the gallium nitride crystal is not cracked during the growth. It may avoid local stresses due to surface irregularities of the seed crystal substrate.

In the method according to the present invention, the second area of the seed crystal substrate more preferably has a surface roughness of 1 μm or less in terms of arithmetic average roughness Ra. This invention can prevent cracking of the gallium nitride crystal during the growth more effectively, so that the gallium nitride crystal can be more reliably grown.

In the method according to the present invention, the first regions are composed of single-crystal gallium nitride, the second region is composed of single-crystal gallium nitride, and the crystal axis of the single-crystal gallium nitride in the first regions has the same orientation as that of the single-crystal gallium nitride in the second region.

According to this method, a gallium nitride crystal having a crystal axis corresponding to that of the single-crystal gallium nitride in the first and second regions is grown on the seed crystal substrate.

In the methods according to the present invention, the seed crystal substrate is prepared by forming a gallium nitride substrate which includes the first regions formed by facet-growing a crystal such that a growth surface thereof is not planar but has three-dimensional growth pits defined by facets and composites thereof and such that the growth pits and the composites thereof are not filled, whereby dislocations are concentrated in the growth pits and the composites thereof.

In the methods according to the present invention, the seed crystal substrate is prepared by forming a gallium nitride substrate which includes the first regions formed by facet-growing a crystal on a base substrate having a mask having regularly striped pattern while linear V-grooves defined by facets are formed and maintained, whereby dislocations are concentrated in the bottoms of the V-grooves defined by the facets.

In the methods according to the present invention, the seed crystal substrate is prepared by forming a gallium nitride substrate which includes the first regions formed by facet-growing a crystal on a base substrate having a regular seed pattern while pits defined by facets are formed and maintained, whereby dislocations are concentrated in the bottoms of the pits defined by the facets.

In the methods according to the present invention, the seed crystal substrate is a free-standing gallium nitride substrate with a thickness of 100 μm or more.

In the methods according to the present invention, the seed crystal substrate is prepared to form a gallium nitride substrate having a surface that is the (0001) plane.

In the methods according to the present invention, the gallium nitride crystal grown on the seed crystal substrate has a thickness of 200 μm or more. The gallium nitride crystal grown on the seed crystal substrate by this method is used to make a free-standing gallium nitride substrate.

The methods according to the present invention can further include the steps of (d) separating the gallium nitride crystal from an integrated piece of the gallium nitride crystal and the seed crystal substrate; and (e) forming a single-crystal gallium nitride wafer from the separated gallium nitride crystal.

According to this method, a free-standing gallium nitride wafer is prepared from the separated gallium nitride crystal.

In the methods according to the present invention, the first regions preferably have 1,000 or more dislocations per area of 10 μm square. In the methods according to the present invention, the first dislocation density is $1\times10^8$ cm$^{-2}$ or more.

A still further aspect of the present invention is a single-crystal gallium nitride wafer fabricated by the above methods, and the dislocation density in a primary surface of the gallium nitride wafer is $1\times10^6$ cm$^{-2}$ or less. In addition, the number of dislocations per area of 10 μm square in any region of a primary surface of a single-crystal gallium nitride wafer manufactured by the above methods is smaller than that in the first regions. In addition, the size of the gallium nitride wafers is 1 cm$^2$ or more. In addition, a single-crystal gallium nitride wafer is manufactured by the above methods, and the maximum dislocation density in a primary surface of the gallium nitride wafer is lower than the first dislocation density.

The present invention is not limited to the above aspects and also has various aspects as described below. The technical contributions of these aspects will be understood from the above description. A yet still further aspect of the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; (b) preparing a seed crystal substrate by forming recesses in the first areas; and (c) growing a gallium nitride crystal on the seed crystal substrate by liquid-phase deposition or vapor-phase deposition such that voids corresponding to the recesses are formed.

According to this method, the recesses are formed in the first areas on the seed crystal substrate, and the gallium nitride crystal is grown on the seed crystal substrate such that the voids are formed. The gallium nitride crystal is therefore integrally grown on the second region. Accordingly, gallium nitride crystal that does not inherit the first regions, which have the crystal axis of opposite orientation, is formed.

A yet still further aspect of the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; (b) preparing a seed crystal substrate by forming recesses in the first areas; and (c) growing a gallium nitride crystal on the seed crystal substrate by vapor-phase deposition at a growth temperature higher than 1,100° C. and equal to or lower than 1,300° C.

According to this method, the gallium nitride crystal is grown on the seed crystal substrate by vapor-phase deposition such that the voids corresponding to the recesses are formed while the gallium nitride crystal is integrally grown on the second region. The gallium nitride crystal is therefore grown not in the first areas but in the second area on the seed crystal substrate. Accordingly, gallium nitride crystal not inheriting the crystal axis of opposite orientation from the first regions is formed. In addition, growing the gallium nitride crystal on the seed crystal substrate at a growth temperature higher than 1,100° C. reduces new dislocations occurring when the gallium nitride crystal grown in the second area is integrally grown over the recesses and also reduces the full width at half maximum of an XRD (004) rocking curve. Another advantage is that the grown gallium nitride crystal can be prevented from being cracked during polishing after slicing, thus improving the yield in the polishing. A growth temperature higher than 1,100° C. may reduce stress-concentrated sites in the gallium nitride crystal to prevent cracking during the polishing. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is, however, that the decomposition rate of the gallium nitride crystal that has been formed increases more significantly than the formation rate of the gallium nitride crystal at extraordinarily high growth temperatures, thus decreasing the net growth rate depending upon the difference between the formation rate and the decomposition rate. Accordingly, extraordinarily high growth temperatures are undesirable, and the growth temperature is preferably equal to or lower than 1,300° C.

In the method according to the present invention, the growth temperature is preferably higher than 1,150° C. and equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of sliced pieces more effectively, thus further improving the yield after the polishing. At a growth temperature exceeding 1,250° C., however, the seed crystal substrate decomposes to some extent, though not so significantly, even though the temperature does not exceed 1,300° C. This precludes growth to form a thick film for a long time and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 µm or less in terms of arithmetic average roughness Ra. According to this invention, the gallium nitride crystal is not cracked during the growth. It may avoid local stresses due to surface irregularities of the seed crystal substrate. In the methods according to the present invention, additionally, the second area of the seed crystal substrate preferably has a surface roughness of 1 µm or less in terms of arithmetic average roughness Ra. This invention can prevent cracking of the gallium nitride crystal during the growth more effectively, so that the gallium nitride crystal can be more reliably grown.

In the methods according to the present invention, preferably, the N-plane of the single-crystal gallium nitride appears on the first areas, the recesses are formed by etching the primary surface of the gallium nitride substrate in the step of preparing the seed crystal substrate by forming the recesses in the first areas, and the etching is performed with at least one of HCl, $Cl_2$, $BCl_3$, and $CCl_4$. In the method according to the present invention, preferably, the N-plane of the single-crystal gallium nitride appears on the first areas, the recesses are formed by etching the primary surface of the gallium nitride substrate in the step of preparing the seed crystal substrate by forming the recesses in the first areas, and the etching is performed with a solution containing at least one of phosphoric acid, nitric acid, and sulfuric acid. In the method according to the present invention, preferably, the N-plane of the single-crystal gallium nitride appears on the first areas, the recesses are formed by etching the primary surface of the gallium nitride substrate in the step of forming the recesses in the first areas to prepare the seed crystal substrate, and the etching is performed with a solution containing at least one of potassium hydroxide and sodium hydroxide. In the method according to the present invention, preferably, the N-plane of the single-crystal gallium nitride appears on the first areas, the recesses are formed by etching the primary surface of the gallium nitride substrate in the step of preparing the seed crystal substrate by forming the recesses in the first areas, and the etching is performed with a melt containing at least one of potassium hydroxide and sodium hydroxide. With such solutions and melts, the N-plane can be selectively etched.

A method according to the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; (b) forming a mask over the first areas to prepare a seed crystal substrate; and (c) growing gallium nitride on the seed crystal substrate by liquid-phase deposition or vapor-phase deposition so as to embed the mask. The first area is covered with the mask.

According to this method, the gallium nitride crystal is grown on the seed crystal substrate so as to embed the mask. Because the gallium nitride crystal is integrally grown on the second region, the gallium nitride crystal is grown not in the first areas but in the second area on the seed crystal substrate. Accordingly, gallium nitride crystal not inheriting the crystal axis of opposite orientation from the first regions is formed.

A method according to the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; (b) forming a mask over the first areas to prepare a seed crystal substrate; and (c) growing a gallium nitride crystal on the seed crystal substrate by vapor-phase deposition at a growth temperature higher than 1,100° C. and equal to or lower than 1,300° C. to form a gallium nitride crystal thicker than the mask. The first area is covered with the mask.

In the method according to the present invention, the growth temperature is preferably higher than 1,150° C. and equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of the slices more effectively, thus further improving the yield after the polishing. At a growth temperature exceeding 1,250° C., however, the seed crystal substrate decomposes to some extent, though not so significantly, even though the temperature does not exceed 1,300° C. This precludes growth to form a thick film for a long time and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 μm or less in terms of arithmetic average roughness Ra. According to this invention, the gallium nitride crystal is not cracked during the growth. It may avoid local stresses due to surface irregularities of the seed crystal substrate. In the methods according to the present invention, additionally, the second area of the seed crystal substrate preferably has a surface roughness of 1 μm or less in terms of arithmetic average roughness Ra. This invention can prevent cracking of the gallium nitride crystal during the growth more effectively, so that the gallium nitride crystal can be more reliably grown. In the methods according to the present invention, additionally, the mask is preferably composed of at least one of silicon oxide and silicon nitride. If the mask is composed of such a material, gallium nitride crystal does not grow thereon, and high-quality gallium nitride growing on the second region grows in the lateral direction, finally forming integrated gallium nitride. In the methods according to the present invention, preferably, each first region has a striped pattern, and the second region is provided between the first regions. In the methods according to the present invention, preferably, the first regions are arranged in an array, and the first regions are separated from each other by the second region.

A method according to the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; forming recesses in the first areas and a mask over the recesses in the first areas to prepare a seed crystal substrate; and (b) growing a gallium nitride crystal on the seed crystal substrate by liquid-phase deposition or vapor-phase deposition such that voids corresponding to the recesses are formed. The mask covers the recesses.

According to this method, the gallium nitride crystal is grown on the seed crystal substrate such that the voids are formed without filling the recesses with the GaN crystal and the gallium nitride crystal is integrally grown on the second region. The gallium nitride crystal is therefore grown not in the first areas but in the second area on the seed crystal substrate. Accordingly, the gallium nitride crystal has a lower dislocation density because gallium nitride crystal not inheriting the crystal axis of opposite orientation from the first regions is formed.

A method according to the present invention is a method for fabricating a gallium nitride crystal. This method includes the steps of (a) preparing a gallium nitride substrate including first regions composed of single-crystal gallium nitride, a second region composed of single-crystal gallium nitride having a crystal axis opposite in orientation to that of the single-crystal gallium nitride in the first regions, and a primary surface including first areas where the first regions appear and a second area where the second region appears; (b) forming recesses in the first areas and a mask over the recesses in the first areas to prepare a seed crystal substrate; and (c) growing a gallium nitride crystal on the seed crystal substrate by vapor-phase deposition at a growth temperature higher than 1,100° C. and equal to or lower than 1,300° C. The recesses are covered with the mask.

According to this method, the gallium nitride crystal is grown on the seed crystal substrate by vapor-phase deposition such that the voids are formed from the recesses while the gallium nitride crystal is integrally grown on the second region. The gallium nitride crystal is therefore grown not in the first areas but in the second area on the seed crystal substrate. Accordingly, the gallium nitride crystal has a lower dislocation density because gallium nitride crystal not inheriting the crystal axis of opposite orientation from the first regions is formed. In addition, growing the gallium nitride crystal on the seed crystal substrate at a growth temperature higher than 1,100° C. reduces new dislocations occurring when the gallium nitride crystal grown in the second area is integrally grown over the recesses and also reduces the full width at half maximum of an XRD (004) rocking curve. Another advantage is that the grown gallium nitride crystal can be prevented from being cracked during polishing after slicing, thus improving the yield after the polishing. A growth temperature higher than 1,100° C. may reduce stress-concentrated sites in the gallium nitride crystal to prevent the cracking during the polishing. A growth temperature exceeding 1,300° C., on the other hand, causes damaging due to accelerated decomposition of the seed crystal substrate and a significant decrease in the growth rate of the gallium nitride crystal. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. Accordingly, extraordinarily high growth temperatures are undesirable, and the growth temperature is preferably equal to or lower than 1,300° C.

In the method according to the present invention, the growth temperature is preferably higher than 1,150° C. and equal to or lower than 1,250° C. According to this invention, growing the gallium nitride crystal on the seed crystal substrate at a growth temperature higher than 1,150° C. further reduces the full width at half maximum of an XRD (004) rocking curve. Another advantage is that the grown gallium nitride crystal can be prevented from being cracked during polishing of the slices more effectively, thus further improving the yield in the polishing. At a growth temperature exceeding 1,250° C., however, the seed crystal substrate decomposes to some extent, though not so significantly, even though the temperature does not exceed 1,300° C. This precludes growth to form a thick film for a long time, and limits the growth rate of the gallium nitride crystal to a certain level, resulting in cost disadvantage. Accordingly, the growth temperature is more preferably equal to or lower than 1,250° C.

In the methods according to the present invention, the second area of the seed crystal substrate preferably has a surface roughness of 10 μm or less in terms of arithmetic average roughness Ra. According to this invention, the gallium nitride crystal is not cracked during the growth. It may avoid local stresses due to surface irregularities of the seed crystal substrate.

In the methods according to the present invention, the second area of the seed crystal substrate preferably has a surface roughness of 1 μm or less in terms of arithmetic average roughness Ra. This invention can prevent cracking of the gallium nitride crystal during the growth more effectively, so that the gallium nitride crystal can be more reliably grown.

In the methods according to the present invention, preferably, the N-plane of the single-crystal gallium nitride appears on the first areas, the recesses are formed by etching the primary surface of the gallium nitride substrate in the step of forming the recesses in the first areas and the mask over the recesses in the first areas to prepare the seed crystal substrate, and the etching is performed with at least one of HCl, $Cl_2$, $BCl_3$, and $CCl_4$. In the methods according to the present invention, preferably, the N-plane of the single-crystal gallium nitride appears on the first areas, the recesses are formed by etching the primary surface of the gallium nitride substrate in the step of forming the recesses in the first areas and the mask over the recesses in the first areas to prepare the seed crystal substrate, and the etching is performed with a solution containing at least one of phosphoric acid, nitric acid, and sulfuric acid. In the methods according to the present invention, preferably, the N-plane of the single-crystal gallium nitride appears on the first areas, the recesses are formed by etching the primary surface of the gallium nitride substrate in the step of forming the recesses in the first areas and the mask so as to cover the recesses in the first areas to prepare the seed crystal substrate, and the etching is performed with a solution containing at least one of potassium hydroxide and sodium hydroxide. In the methods according to the present invention, preferably, the N-plane of the single-crystal gallium nitride appears on the first areas, the recesses are formed by etching the primary surface of the gallium nitride substrate in the step of forming the recesses in the first areas and the mask over the recesses in the first areas to prepare the seed crystal substrate, and the etching is performed with a melt containing at least one of potassium hydroxide and sodium hydroxide. With such solutions and melts, the N-plane can be selectively etched.

In the methods according to the present invention, the mask is preferably composed of at least one of silicon oxide and silicon nitride. If the mask is composed of such a material, no gallium nitride crystal grows thereon, and high-quality gallium nitride growing on the second region grows in the lateral direction, finally forming integrated gallium nitride.

In the methods according to the present invention, the seed crystal substrate is preferably a free-standing gallium nitride substrate with a thickness of 100 μm or more. In the methods according to the present invention, additionally, a surface of the seed crystal substrate is preferably the (0001) plane. In the methods according to the present invention, additionally, the gallium nitride crystal grown on the seed crystal substrate preferably has a thickness of 200 μm or more. In addition, the methods according to the present invention can further include the steps of separating the gallium nitride crystal from an integrated piece of the gallium nitride crystal and the seed crystal substrate; and forming a single-crystal gallium nitride wafer from the separated gallium nitride crystal.

A single-crystal gallium nitride wafer according to the present invention is a single-crystal gallium nitride wafer manufactured by the above methods, and the crystal axis of the single-crystal gallium nitride has the same orientation in any region of the gallium nitride wafer. In addition, the size of the gallium nitride wafer according to the present invention is 1 $cm^2$ or more.

The above and other objects, features, and advantages of the present invention will more easily be clarified from the following detailed description of preferred embodiments of the present invention with reference to the attached drawings.

Advantages

The present invention, as described above, provides a method for fabricating a gallium nitride crystal with low dislocation density, high crystallinity, and resistance to cracking during polishing of sliced pieces by growing the gallium nitride crystal on a seed crystal substrate including dislocation-concentrated regions or inverted-polarity regions, and also provides a gallium nitride wafer.

BRIEF DESCRIPTION OF DRAWINGS

FIG. 1 includes a process flowchart illustrating a method for fabricating a gallium nitride crystal according to a first embodiment and a diagram illustrating a gallium nitride wafer.

FIG. 2 includes a diagram illustrating a gallium nitride substrate, a diagram, taken from Box, of an example of the structure of the gallium nitride substrate, and a diagram, taken from Box, of another example of the structure of the gallium nitride substrate.

FIG. 3 includes a sectional view taken along line I-I of FIG. 2 and a diagram illustrating a step of the method for fabricating a gallium nitride crystal according to the first embodiment.

FIG. 4 includes diagrams illustrating steps of the method for fabricating a gallium nitride crystal according to the first embodiment.

FIG. 8 includes diagrams illustrating steps of the method for fabricating a gallium nitride crystal according to the second embodiment.

FIG. 11 includes diagrams illustrating steps of the method for fabricating a gallium nitride crystal according to the third embodiment.

FIG. 12 includes diagrams illustrating main steps of fabricating a seed crystal substrate according to an additional embodiment.

REFERENCE NUMERALS

Figure 5:
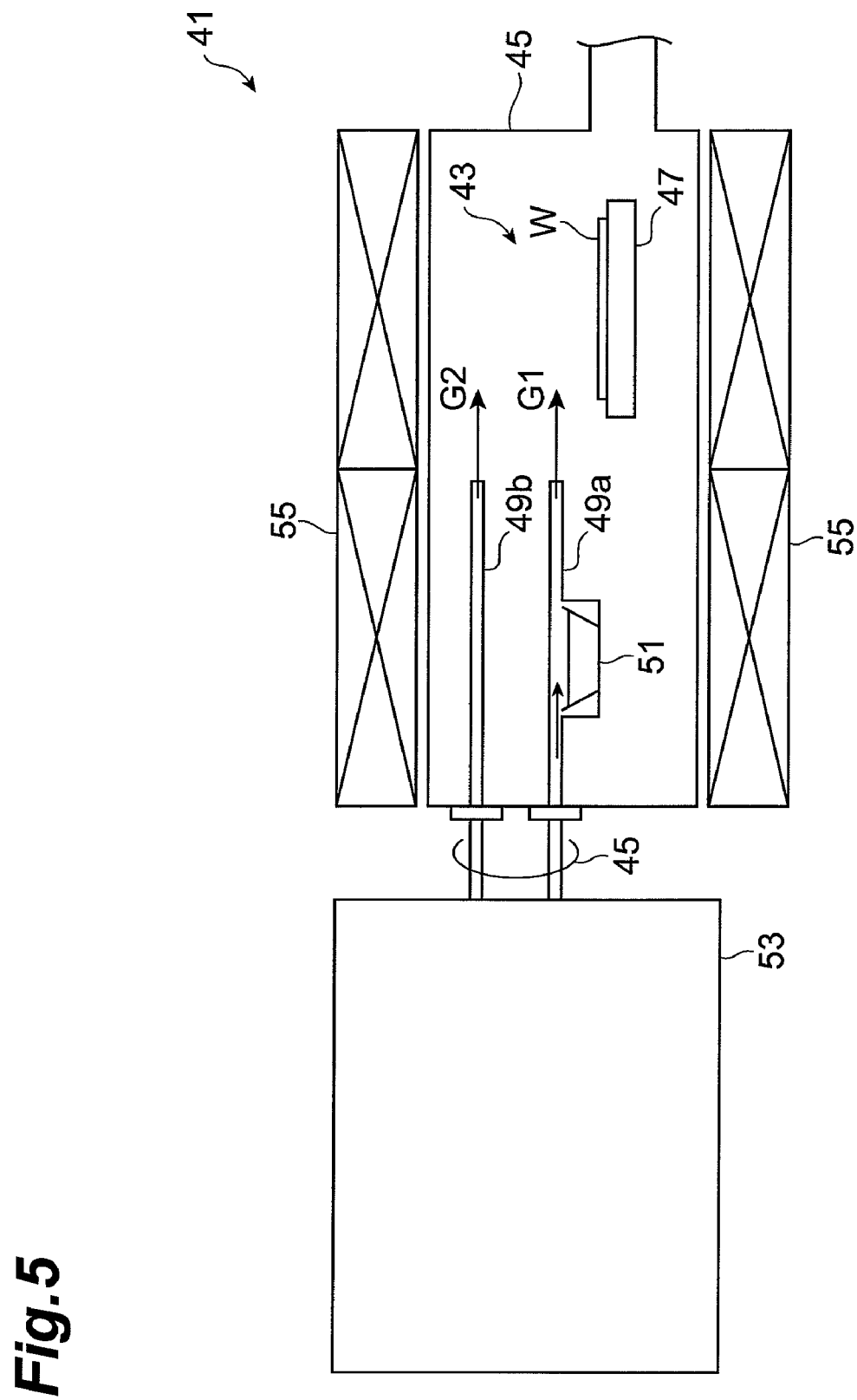
FIG. 5 is a diagram illustrating the structure of a growth furnace used in Examples.

100*a*, 100*b*, and 100*c*: process flow; 11: gallium nitride substrate; 13: primary surface of gallium nitride substrate; 15:

back surface of gallium nitride substrate; 11*a*: gallium nitride substrate; 17*a*: first region; 19*a*: second region; 15*a*: back surface of gallium nitride substrate; 13*a*: primary surface of gallium nitride substrate; 21*a*: first area; 23*a*: second area; 11*b*: gallium nitride substrate; 13*b*: primary surface of gallium nitride substrate; 15*b*: back surface of gallium nitride substrate; 17*b*: first region; 19*b*: second region; 21*b*: first area; 23*b*: second area; 25: recess; 27: seed crystal substrate; 25*a*: bottom surface of recess; 25*b* and 25*c*: side surface of recess; W1: opening width of recess; D1: depth of recess; D1/W1: aspect ratio of recess; 29: gallium nitride crystal; 31: void; H1: thickness of gallium nitride crystal; $T_G$: growth temperature; S101 to S108: step; Wafer: gallium nitride wafer; 41: growth furnace; 43: growth chamber; 45: reaction tube; 47: support; 49*a*: first line; 49*b*: second line; 53: gas unit; 51: boat; 55: heating unit; 57: seed crystal substrate; 58: mask; W2: width of first area; W3: width of mask; D2: thickness of mask; H2: thickness of gallium nitride crystal; 59: gallium nitride crystal; 63: separated gallium nitride crystal; 77: seed crystal substrate; 79: gallium nitride crystal; 83: separated gallium nitride crystal

BEST MODES FOR CARRYING OUT THE INVENTION

The teachings of the present invention can readily be understood from the following detailed description with reference to the accompanied drawings, which are presented for illustration. Embodiments of methods for fabricating a gallium nitride crystal and gallium nitride wafers according to the invention will now be described with reference to the attached drawings, where identified portions are denoted by identified references, if possible.

First Embodiment

With reference to FIG. 1, a method for fabricating a gallium nitride crystal according to this embodiment will now be described. FIG. 1 shows a process flow 100*a*. Part (A) of FIG. 2 is a diagram illustrating a gallium nitride substrate. In Step S101, a gallium nitride substrate 11 is prepared. In Part (A) of FIG. 2, the gallium nitride substrate 11 has a primary surface 13 and a back surface 15. Part (B) of FIG. 2 is a sectional view, taken from Box of Part (A) of FIG. 2, showing an example of the structure of the gallium nitride substrate. Part (C) of FIG. 2 is a sectional view, taken from Box of Part (A) of FIG. 2, showing another example of the structure of the gallium nitride substrate. The Cartesian coordinate system S is shown in Parts (B) and (C) of FIG. 2.

Referring to Part (B) of FIG. 2, a gallium nitride substrate 11*a* is shown. The gallium nitride substrate 11*a* includes a plurality of first regions 17*a* having a dislocation density higher than a predetermined dislocation density and second regions 19*a* having a dislocation density lower than the predetermined dislocation density. The predetermined dislocation density is, for example, $8 \times 10^7$ cm$^{-2}$. The first regions 17*a* are also called dislocation-concentrated regions. The first regions 17*a* extend in one direction from a back surface 15*a* to a primary surface 13*a* of the gallium nitride substrate 11*a*, for example, parallel to the XY plane. The first regions 17*a* extend in a striped pattern in the Y direction. The second regions 19*a* are separated by the first regions 17*a*. The first regions 17*a* and the second regions 19*a* are alternately arranged in the Z-axis direction. The primary surface 13*a* of the gallium nitride substrate 11*a* has first areas 21*a* where the first regions 17*a* are exposed and second areas 23*a* where the second regions 19*a* are exposed. The first areas 21*a* and the second areas 23*a* are alternately arranged in the Z-axis direction. Preferably, the first areas 21*a* and the second areas 23*a* are regularly arranged.

Referring to Part (C) of FIG. 2, a gallium nitride substrate 11*b* is shown. The gallium nitride substrate 11*b* includes a plurality of first regions 17*b* having a dislocation density higher than a predetermined dislocation density and a second region 19*b* having a dislocation density lower than the predetermined dislocation density. The predetermined dislocation density is, for example, $8 \times 10^7$ cm$^{-2}$. The first regions 17*b* extend in one direction from a back surface 15*b* to a primary surface 13*b* of the gallium nitride substrate 11*b*, for example, in the X-axis direction. The first regions 17*b* are, for example, regularly arranged in the Y-axis direction. The first regions 17*b* are also, for example, regularly arranged in the Z-axis direction. The first regions 17*b* are surrounded by the single second region 19*b*. The primary surface 13*b* of the gallium nitride substrate 11*b* has first areas 21*b* where the first regions 17*b* are exposed and a second area 23*b* where the second region 19*b* are exposed. The first areas 21*b* are alternately arranged in the Z-axis direction.

Parts (B) and (C) of FIG. 2 are merely illustrative of the structure of the gallium nitride substrate; the structure of the gallium nitride substrate applied to this embodiment is not limited to the specific structures shown in the drawings.

In addition, an example of a gallium nitride substrate can include first regions 17*a* (17*b*) composed of single-crystal gallium nitride and second regions 19*a* (19*b*) composed of single-crystal gallium nitride. The crystal axis of the single-crystal gallium nitride in the first regions 17*a* (17*b*) is opposite in orientation to that of the single-crystal gallium nitride in the second regions 19*a* (19*b*).

Part (A) of FIG. 3 is a sectional view taken along line I-I of Part (B) of FIG. 2. A sectional view taken along line II-II of Part (C) of FIG. 2 corresponds to the sectional view taken along line I-I of Part (B) of FIG. 2. The subsequent description will focus on the gallium nitride substrate shown in Part (B) of FIG. 2. In Step S102 of FIG. 1, a seed crystal substrate 27 shown in Part (B) of FIG. 3 is prepared by forming recesses 25 in the first areas 21*a*. In Part (B) of FIG. 3, the recesses 25 extend in the Y-axis direction and have bottom surfaces 25*a* and side surfaces 25*b* and 25*c*. The first regions 17*a* are exposed in the bottom surfaces 25*a*. The second regions 19*b* are exposed in the side surfaces 25*b* and 25*c*. If the gallium nitride substrate 11*b* shown in Part (C) of FIG. 2 is used, the recesses 25 are depressions in the primary surface 13*b* of the gallium nitride substrate 11*b*, which are provided in an array. These depressions have bottom surfaces where the first regions 17*b* are exposed and side surfaces where the second region 12*b* is exposed.

Next, examples of how the recesses 25 are formed will be described. In a preferred embodiment, the nitrogen (N) plane of the single-crystal gallium nitride is exposed on the first areas 21*a* of the gallium nitride substrate 11*a*, whereas the gallium (Ga) plane of the single-crystal gallium nitride is exposed on the second areas 23*a* of the gallium nitride substrate 11*a*; the first regions are also called inverted-polarity regions.

According to a first forming method, the recesses 25 are formed by dry-etching the primary surface 13*a* of the gallium nitride substrate 11*a*. The etching is performed with at least one gas of HCl, Cl$_2$, BCl$_3$, and CCl$_4$. The recesses are formed when the primary surface 13*a* of the gallium nitride substrate 11*a* is subjected to the etching gas because of a difference in etching rate between the first areas 21*a* and the second areas 23*a*. This method allows selective dry etching of the single-crystal gallium nitride in the first areas 21*a* because the crystal axis of the single-crystal gallium nitride in the first regions 17a is opposite in orientation to that of the single-crystal gallium nitride in the second regions 19a. Through the dry etching, the recesses 25 are formed in the primary surface 13a of the gallium nitride substrate 11a to provide the seed crystal substrate 27 is provided. The substrate temperature during the dry etching is preferably 20° C. or higher because it will ensure an etching rate required to form the recesses in the first areas 21a. The substrate temperature, on the other hand, is preferably 900° C. or lower because a temperature exceeding 900° C. would cause a significant etching damage to the surface and thereby adversely affecting the quality of the crystal to be grown thereon.

According to a second forming method, the recesses 25 are formed by wet-etching the primary surface 13a of the gallium nitride substrate 11a with an acid. The etching is performed with a solution containing at least one of phosphoric acid, nitric acid, and sulfuric acid. This method allows selective wet etching of the single-crystal gallium nitride in the first areas 21a with a solution containing at least one of phosphoric acid, nitric acid, and sulfuric acid because the crystal axis of the single-crystal gallium nitride in the first regions 17a is opposite in orientation to that of the single-crystal gallium nitride in the second regions 19a. Through the wet etching, the recesses 25 are formed in the primary surface 13a of the gallium nitride substrate 11a to prepare the seed crystal substrate 27.

According to a third forming method, the recesses 25 are formed by wet-etching the primary surface 13a of the gallium nitride substrate 11a with an alkali. The etching is performed with a solution containing potassium hydroxide. This method allows selective wet etching of the single-crystal gallium nitride in the first areas 21a with a solution containing potassium hydroxide because the crystal axis of the single-crystal gallium nitride in the first regions 17a is opposite in orientation to that of the single-crystal gallium nitride in the second regions 19a. Through the wet etching, the recesses 25 are formed in the primary surface 13a of the gallium nitride substrate 11a to prepare the seed crystal substrate 27.

Alternatively, the etching can be performed with a solution containing sodium hydroxide. Also, the etching can be performed with a solution containing at least one of potassium hydroxide and sodium hydroxide. These etchants allow selective wet etching of the single-crystal gallium nitride in the first areas 21a, whereby the seed crystal substrate 27 can be prepared.

The recesses 25 are thus also formed on the primary surface 13a of the gallium nitride substrate 11a through wet etching with these etchants.

Alternatively, the etching can be performed with a melt containing potassium hydroxide, or can be performed with a melt containing sodium hydroxide. Also, the etching can be performed with a melt containing at least one of potassium hydroxide and sodium hydroxide. These melts can be used to perform desired etching within a shorter period of time than that required for their solutions.

In a preferred embodiment, the recesses 25 have an opening width W1 of, for example, 5 to 200 µm, a depth D1 of, for example, 10 µm or more, and an aspect ratio (D1/W1) of 2 or more.

In Step S103 of FIG. 1, after the recesses 25 are formed on the gallium nitride substrate 11a, a gallium nitride crystal 29 is grown on the seed crystal substrate 27 by liquid-phase deposition or vapor-phase deposition, as shown in Part (A) of FIG. 4. The gallium nitride crystal 29 is grown on the seed crystal substrate 27 such that voids 31 corresponding to the recesses 25 are formed. The gallium nitride crystal 29 is a thick film with a thickness H1 of, for example, 200 µm or more. The gallium nitride crystal 29 grown on the seed crystal substrate 27 by this method is used to manufacture a free-standing gallium nitride substrate.

According to this method, when the gallium nitride crystal 29 is grown on the seed crystal substrate 27 by liquid-phase deposition or vapor-phase deposition, the voids 31 associated to the recesses 25 are formed while gallium nitride crystals grown on the second regions 19a are integrated into the gallium nitride crystal 29. The gallium nitride crystal 29 is grown not in the first areas 21a but in the second areas 23a on the seed crystal substrate 27. Accordingly, the gallium nitride crystal 29 has a lower dislocation density because it does not inherit dislocations from the first regions 17a.

In the vapor-phase deposition of the gallium nitride crystal 29 on the seed crystal substrate 27 having the recesses 25, as shown in Part (B) of FIG. 3, the growth temperature $T_G$ is preferably higher than 1,100° C. This reduces additional dislocations occurring when the gallium nitride crystals grown on the second regions 19b are integrated over the recesses 25 without filling them, and also alleviates the effect of variations in the crystal quality of the second regions 19b. The full width at half maximum of an X-ray rocking curve XRD (004), which is at least about 100 seconds for temperatures of not higher than 1,100° C., falls below 100 seconds. The present embodiment has another advantage that the grown gallium nitride crystal 29 can be prevented from being cracked during polishing after slicing, thus improving the yield in the polishing. A growth temperature higher than 1,100° C. can reduce stress-concentrated sites in the gallium nitride crystal to prevent cracking during the polishing. The yield after the polishing, which is about 80% for temperatures of not higher than 1,100° C., increases to 90% or more.

In addition, in the case of vapor-phase deposition of the gallium nitride crystal 29 on the seed crystal substrate 27 having the recesses 25, as shown in Part (B) of FIG. 3, the growth temperature $T_G$ is preferably 1,300° C. or lower. A higher substrate temperature $T_G$ causes damaging due to accelerated decomposition of the seed crystal substrate 27 and a significant decrease in the growth rate of the gallium nitride crystal 29. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. If the temperature exceeds 1,300° C., the growth rate will not be higher than 10 µm/h. Thus, if the growth temperature $T_G$ is 1,300° C. or lower, a thick film of the gallium nitride crystal 29 can be formed within a practical period of time with less damage to the seed crystal substrate 27.

In another embodiment, the growth temperature $T_G$ is preferably higher than 1,150° C. This reduces the full width at half maximum of an X-ray rocking curve XRD (004) to about 50 seconds and also increases the yield after the polishing to 95% or more. The growth temperature $T_G$ is preferably 1,250° C. or lower. At a growth temperature exceeding 1,250° C., the seed crystal substrate decomposes to some extent, though not so significantly, even though the temperature does not exceed 1,300° C. This precludes growth to from a thick film for a long time, and limits the growth rate of the gallium nitride crystal to a certain level, resulting in cost disadvantage. Accordingly, the growth temperature is preferably 1,250° C. or lower. A temperature of 1,250° C. or lower facilitates the thick film growth and can increase the growth rate to 30 µm/h or more, so that a thicker film of the gallium nitride crystal 29 can be formed within a more practical period of time.

The gallium nitride crystal provided in this embodiment has improved crystal quality because the high-temperature growth prevents the generation of new dislocations and provides high crystallinity. Also, the gallium nitride crystal exhibits resistance to cracking during polishing after slicing.

In addition, the second areas 23a (23b) preferably have a surface roughness of 10 µm or less in terms of arithmetic average roughness Ra. In this case, cracking of the gallium nitride crystal 29, presumably due to the surface roughness of the seed crystal substrate 27, can be prevented, so that the gallium nitride crystal 29 can be reliably grown.

More preferably, the second areas 23a (23b) more preferably have a surface roughness of 1 µm or less in terms of arithmetic average roughness Ra. In this case, cracking of the gallium nitride crystal 29, presumably due to the surface roughness of the seed crystal substrate 27, can be prevented more effectively, so that the gallium nitride crystal 29 can be more reliably grown.

For the crystal growth, for example, a growth furnace applicable to hydride vapor-phase epitaxy is used. FIG. 5 is a diagram showing the growth furnace used in the examples to be described below. A growth furnace 41 includes a reaction tube 45 for supplying gas into a growth chamber 43. A support 47 on which a seed crystal substrate is placed is disposed in the reaction tube 45. The support 47 is provided with a heater for heating the substrate. Instead of providing the heater on the support 47, the substrate may be heated by raising the temperature of the support 47 by high-frequency induction heating using a high-frequency coil provided outside the reaction tube 45, and either method is permitted. A first line 49a and a second line 49b extend from a gas unit 53 to the interior of the reaction tube 45. The first line 49a is connected to a hydrogen chloride source and a hydrogen gas source. The first line 49a is connected to a boat 51 for a gallium material. Metallic gallium is placed in the boat 51. The second line 49b is connected to a hydrogen chloride source, an ammonia source, and a hydrogen gas source. The reaction tube 45 is surrounded by heating units 55.

To grow a gallium nitride crystal, a mixed gas of hydrogen chloride and hydrogen gas is supplied from the first line 49a. The hydrogen chloride reacts with the gallium to form gallium chloride. A mixed gas G1 of gallium chloride and hydrogen is supplied into the reaction tube 45. A mixed gas G2 of ammonia and hydrogen gas is supplied from the second line 49b. These mixed gases form a gallium nitride crystal on the substrate in the reaction tube 45.

In a preferred embodiment, etching can be performed in the same furnace to form recesses. In this case, hydrogen gas is supplied from the first line 49a. A mixed gas of hydrogen chloride and hydrogen gas is supplied from the second line 49b. These mixed gases selectively etch the first regions of the gallium nitride substrate in the reaction tube 45. After the etching, a gallium nitride crystal is grown.

In Step S104 of FIG. 1, subsequently, a gallium nitride crystal 33 is separated from the integrated piece of the gallium nitride crystal 29 and the seed crystal substrate 27. The gallium nitride crystal 33 can be separated by slicing (cutting) or grinding. In subsequent Step S105 of FIG. 1, a gallium nitride wafer is formed from the separated gallium nitride crystal 33. The separated gallium nitride crystal 33 is sliced into a predetermined thickness and is mirror-polished. A damaged layer formed during the polishing is removed to complete the gallium nitride wafer. According to this method, a free-standing gallium nitride wafer is prepared from the separated gallium nitride crystal. Part (B) of FIG. 1 is a diagram showing the finished gallium nitride wafer. A gallium nitride wafer Wafer is made of single-crystal gallium nitride including no dislocation-concentrated regions or inverted regions. The maximum dislocation density in a primary surface of the gallium, nitride wafer Wafer is lower than a first dislocation density. The dislocation density in the primary surface of the gallium nitride wafer Wafer is $1 \times 10^6$ cm$^{-2}$ or less. In addition, the gallium nitride wafer has a size of an area of 1 cm$^2$ or more. The full width at half maximum of an X-ray rocking curve (XRD) falls below 100 seconds.

The method used for the gallium nitride substrate 11a according to the embodiment described above can also be used for a gallium nitride substrate having no or little difference in dislocation density between the first regions 17a and the second regions 19a, for example, a gallium nitride substrate including inverted-polarity regions where dislocations are not concentrated. This method can make a low-dislocation-density gallium nitride crystal or gallium nitride substrate which does not inherit inverted-polarity regions and in which dislocations are not generated in gallium nitride over the inverted-polarity regions, and can make crystals in high slicing yield.

The above gallium nitride wafer is used to manufacture an epitaxial substrate. The epitaxial substrate includes one or more gallium nitride semiconductor films provided on the gallium nitride wafer. The gallium nitride wafer can be used as a substrate of, for example, optical devices (such as light-emitting diodes and laser diodes), electronic devices (such as rectifiers, bipolar transistors, field-effect transistors, and HEMTs), semiconductor sensors (such as temperature sensors, pressure sensors, radiation sensors, and visible/ultraviolet light detectors), SAW devices, vibrators, resonators, oscillators, MEMS components, and piezoelectric actuators.

Example 1

In a growth furnace capable of locally heating a gallium nitride substrate, as shown in FIG. 5, a gallium nitride crystal was grown by HVPE. The gallium nitride substrate included dislocation-concentrated regions regularly arranged in a striped pattern and non-dislocation-concentrated regions delimited by the dislocation-concentrated regions and had the structure shown in Part (B) of FIG. 2. The dislocation-concentrated regions are formed by facet-growing the gallium nitride crystal while linear V-grooves defined by facets are formed and maintained, whereby dislocations were concentrated in the bottoms of the V-grooves defined by the facets. The dislocation-concentrated regions had inverted-polarity regions, whereas the non-dislocation-concentrated regions had uninverted-polarity regions. The gallium nitride substrate had a size of two inches and a thickness of 400 µm, and its primary surface was the (0001) plane. The gallium nitride substrate was placed on a support in a reaction tube. The substrate temperature was raised to 800° C., and the inverted-polarity regions of the gallium nitride substrate were selectively etched by supplying HCl gas. Through the etching, a seed crystal substrate was prepared. The seed crystal substrate had the arrangement of grooves formed by transferring the pattern of the inverted-polarity regions thereto. Subsequently, the substrate temperature was set to 1,200° C. The substrate temperature was determined from the results of a temperature measurement carried out in advance by use of a thermocouple attached to an alumina substrate placed on the support and. The alumina substrate had a thickness of 1 mm and a size of 2 inches. The substrate temperature was set to 1,200° C. by adjusting the substrate heater to the temperature conditions in which the thermocouple on the alumina substrate read 1,200° C. Gallium chloride was produced by heating a gallium boat filled with gallium to 800° C. while supplying HCl gas and $H_2$ gas. A gallium nitride crystal was grown into a thickness of 400 μm on the seed crystal substrate by supplying the gallium chloride gas and ammonia gas. The partial pressures of HCl and $NH_3$ were adjusted such that the growth rate reached 50 μm/h or more without polycrystal formation. A crystal quality analysis of the resulting gallium nitride crystal by X-ray diffractometry (XRD) showed that the full width at half maximum of a rocking curve for the (004) plane was 50 seconds, which is an excellent level. Then, the surface of the formed gallium nitride crystal was etched with a KOH—NaOH mixed melt at 350° C. The dislocation density was evaluated by counting the number of etch pits on the etched surface; they are formed at positions corresponding to dislocations. The dislocation density was $5\times10^5$ cm$^{-2}$, meaning that a low-dislocation-density gallium nitride crystal was grown. When the gallium nitride crystal was immersed in a melt containing potassium hydroxide, no recesses corresponding to inverted-polarity regions were formed, meaning that a crystal containing no inverted phase was grown.

Example 2

A gallium nitride crystal was grown under the same conditions as those used in Example 1 except that the crystal was grown into a thickness of 10 mm. The resultant gallium nitride crystal was sliced in a direction parallel to the surface of the seed-crystal substrate to form gallium nitride slices, and these slices were mirror-polished, thus preparing ten gallium nitride crystal substrates with a thickness of 400 μm. None of the ten substrates was cracked during the polishing; the polishing yield was 100%. One of the ten substrates was picked out and etched with a KOH—NaOH mixed melt at 350° C. The dislocation density was evaluated by counting the number of etch pits on the etched surface; they appear at positions corresponding to dislocations. The dislocation density was $5\times10^5$ cm$^{-2}$, meaning that a low-dislocation-density gallium nitride crystal was obtained. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, no recesses corresponding to inverted-polarity regions were formed, meaning that a crystal without inverted-polarity phase was obtained.

Example 3

A gallium nitride substrate of the same type as used in Example 1 was prepared. The inverted-polarity regions of the gallium nitride substrate were selectively etched with plasma by introducing $BCl_3$ gas into a reactive ion etching (RIE) system. Through the etching, a seed crystal substrate was prepared. The seed crystal substrate had the arrangement of grooves formed by transferring the pattern for the inverted-polarity regions thereto. Subsequently, a gallium nitride crystal was grown under the same conditions as those used in Example 1. The surface of the resultant gallium nitride crystal was etched with a KOH—NaOH mixed melt at 350° C. The dislocation density was evaluated by counting the number of etch pits on the etched surface; they appear at positions corresponding to dislocations. The dislocation density was $5\times10^5$ cm$^{-2}$, meaning that a low-dislocation-density gallium nitride crystal was grown. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, recesses corresponding to inverted-polarity regions were not formed, meaning that a crystal containing no inverted phase was grown.

Example 4

A gallium nitride substrate of the same type as used in Example 1 was prepared. The inverted-polarity regions of the gallium nitride substrate were selectively etched with a mixed acid of phosphoric acid and sulfuric acid (the ratio is phosphoric acid:sulfuric acid=1:1). Through the etching, a seed crystal substrate was prepared. The seed crystal substrate had grooves corresponding to the pattern of the inverted-polarity regions. Subsequently, a gallium nitride crystal was grown under the same conditions as those used in Example 1. The surface of the resultant gallium nitride crystal was etched with a KOH—NaOH mixed melt at 350° C. The dislocation density was evaluated by counting the number of etch pits on the etched surface; they appear at positions corresponding to dislocations. The dislocation density was $5\times10^5$ cm$^{-2}$, meaning that a low-dislocation-density gallium nitride crystal was obtained. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, no recesses corresponding to inverted regions were formed, meaning that a crystal containing no inverted phase was obtained.

Comparative Example

A gallium nitride substrate of the same type as used in Example 1 was prepared, and a seed crystal substrate was prepared. Subsequently, a gallium nitride crystal was grown on the seed crystal substrate at a substrate temperature of 1,000° C. (the growth conditions other than the temperature were the same as those in Example 1). The surface of the resultant gallium nitride crystal was etched with a KOH—NaOH mixed melt at 350° C. The dislocation density was evaluated by counting the number of etch pits on the etched surface; they appear at positions corresponding to dislocations. The dislocation density was $1\times10^6$ cm$^{-2}$, meaning that a low-dislocation-density gallium nitride crystal was obtained. A crystal quality analysis of the gallium nitride crystal by X-ray diffractometry (XRD) showed that the full width at half maximum of a rocking curve for the (004) plane was 120 seconds.

According to this embodiment, a gallium nitride crystal with low dislocation density, high crystallinity, and resistance to cracking during polishing of sliced pieces is provided because the gallium nitride crystal is grown at high temperature.

Second Embodiment

Figure 6:
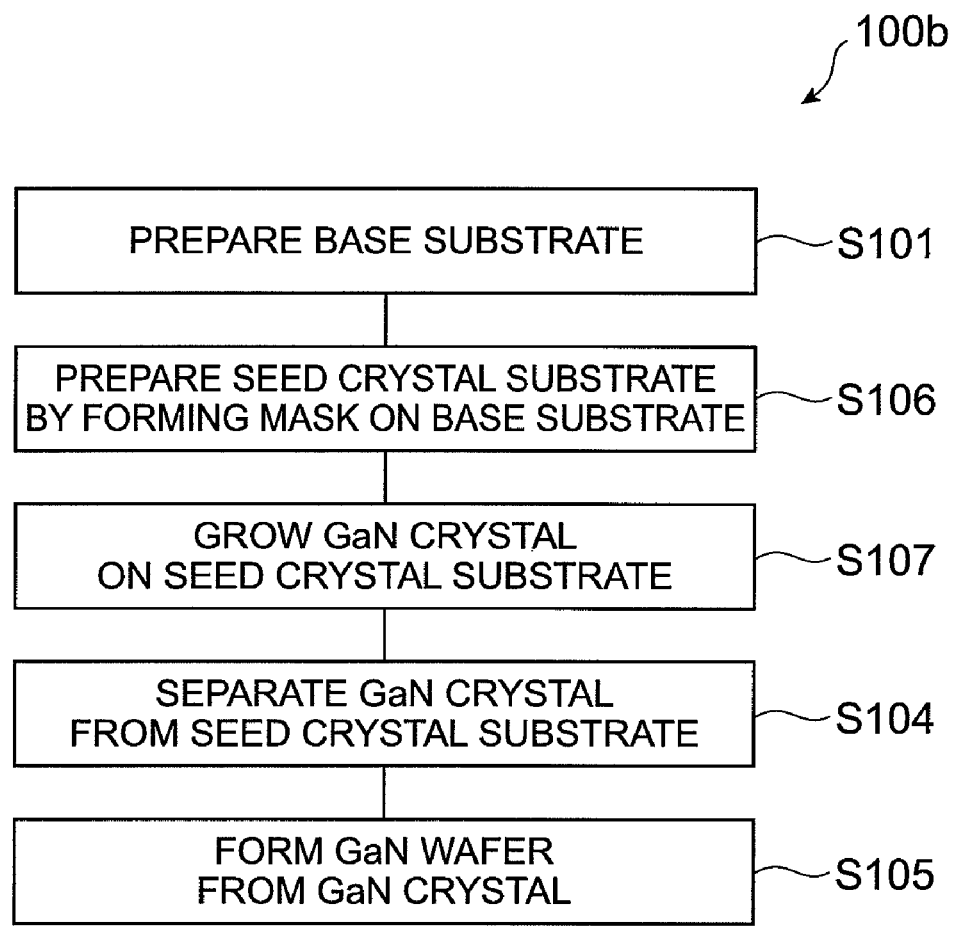
FIG. 6 is a flowchart illustrating a method for fabricating a gallium nitride crystal according to a second embodiment.

With reference to FIG. 6, a method for fabricating a gallium nitride crystal according to this embodiment will now be described. FIG. 6 shows a process flow 100b. Part (A) of FIG. 2 is a diagram illustrating a gallium nitride substrate. In Step S101, a gallium nitride substrate 11 is prepared. As in the first embodiment, the gallium nitride substrate 11 used may be either of the types shown in Parts (B) and (C) of FIG. 2. Also, in this embodiment, Parts (B) and (C) of FIG. 2 are merely illustrative of the structure of the gallium nitride substrate; the structure of the gallium nitride substrate applied to this embodiment is not limited to the specific structures shown in the drawings.

Figure 7:
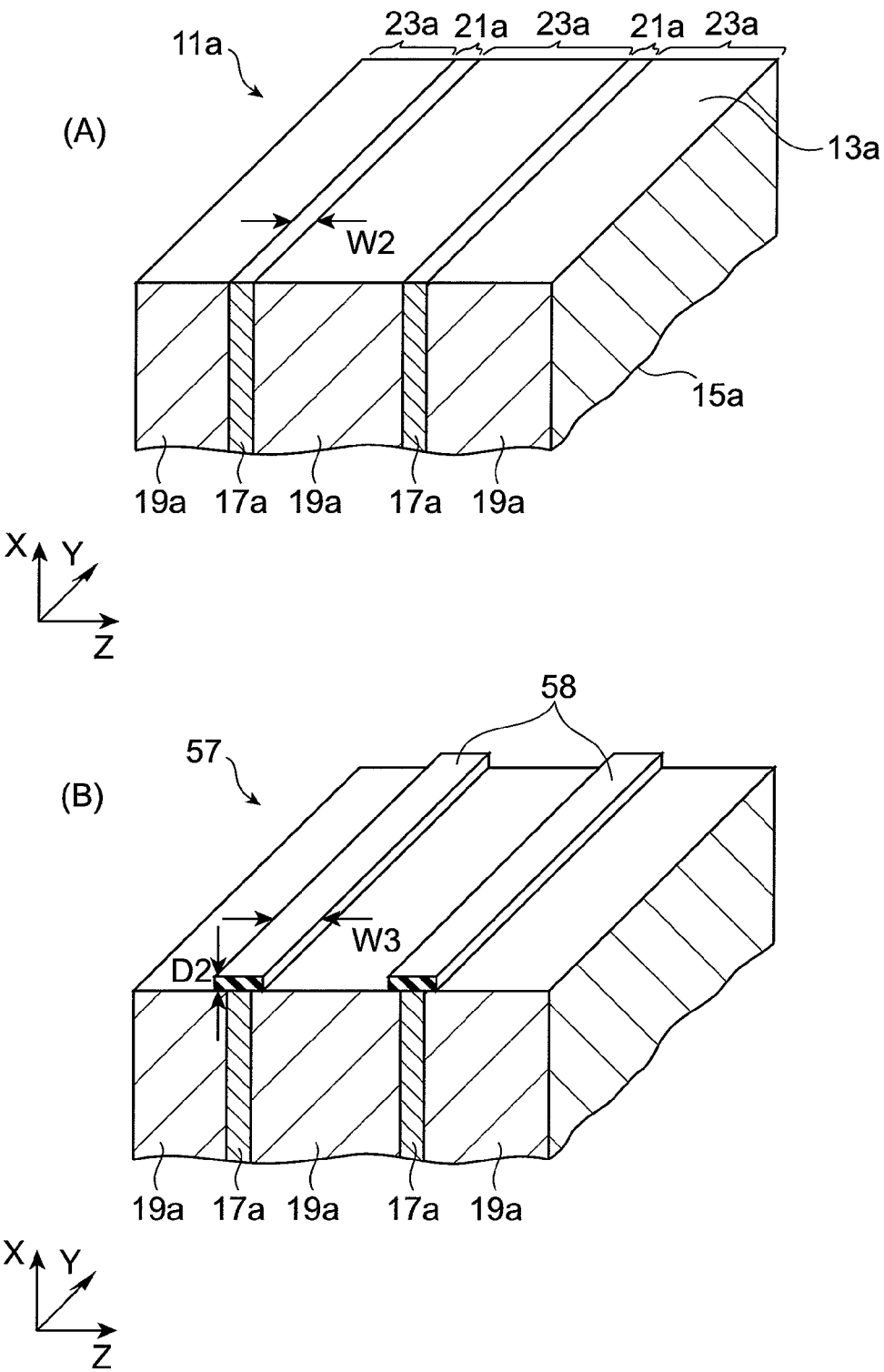
FIG. 7 includes a sectional view taken along line I-I of FIG. 2 and a diagram illustrating a step of the method for fabricating a gallium nitride crystal according to the second embodiment.

Part (A) of FIG. 7 is a sectional view taken along line I-I of Part (B) of FIG. 2. A sectional view taken along line II-II of Part (C) of FIG. 2 corresponds to the sectional view taken along line I-I of Part (B) of FIG. 2. The subsequent description will focus on the gallium nitride substrate shown in Part (B) of FIG. 2. In Step S106 of FIG. 6, a mask 58 is formed so as to cover the first areas 21a to prepare a seed crystal substrate 57 shown in Part (B) of FIG. 7. The actual pattern of the mask 58 is determined depending on the pattern of the first areas 21a. In Part (B) of FIG. 7, the mask 58 extends in the Y-axis direction and covers the first areas 21a and parts of the second areas 23a, which extend along the first areas 21a. The mask 58 is formed so that the first regions 17a are not exposed. The second areas 23a, composed of gallium nitride, and the mask 58, composed of a material different from gallium nitride, appear alternately in the primary surface of the seed crystal substrate 57. The mask 58 is preferably composed of at least one of silicon oxide and silicon nitride. If the mask 58 is composed of such a material, no gallium nitride crystal grows thereon, and high-quality gallium nitride crystals growing on the second regions 19a grow in the transverse direction, finally forming an integrated gallium nitride crystal.

In a preferred embodiment, the first areas 21a have a width W2 of, for example, 5 to 200 μm, and the mask 58 has a width W3 of, for example, 10 to 250 μm and a thickness D2 of, for example, 5 to 20 μm.

In Step S107 of FIG. 6, after the mask 58 is formed on the gallium nitride substrate 11a, a gallium nitride crystal 59 is grown on the seed crystal substrate 57 by liquid-phase deposition or vapor-phase deposition, as shown in Part (A) of FIG. 8. The gallium nitride crystal 59 is grown on the seed crystal substrate 57 so as to cover the mask 58. The gallium nitride crystal 59 is made of a thick film with a thickness 12 similar to, for example, the thickness H1 of the gallium nitride crystal 29. The gallium nitride crystal 59 grown on the seed crystal substrate 57 by this method is used to manufacture a free-standing gallium nitride substrate.

According to this method, the mask 58 is embedded under the gallium nitride crystal 59 by selectively growing gallium nitride crystals in the second areas 23a on the seed crystal substrate 57 by liquid-phase deposition or vapor-phase deposition, so that the gallium nitride crystals grown on the second regions 19a are integrated. Accordingly, the gallium nitride crystal 59 has a lower dislocation density because no gallium nitride crystal inheriting dislocations from the first regions 17a is formed.

In the case of vapor-phase deposition of the gallium nitride crystal 59 on the seed crystal substrate 57 having the mask, as shown in Part (B) of FIG. 7, the growth temperature $T_G$ is preferably higher than 1,100° C. This reduces new dislocations occurring when the gallium nitride crystals grown on the second regions 19a are integrated over the mask 58 and also alleviates the effect of variations in the crystal quality of the second regions 19a. The full width at half maximum of an X-ray rocking curve XRD (004), which is at least about 100 seconds for temperatures of not higher than 1,100° C., falls below 100 seconds. Another advantage is that the grown gallium nitride crystal 59 can be prevented from being cracked during polishing after slicing, thus improving the yield after the polishing. A growth temperature higher than 1,100° C. may reduce stress-concentrated sites in the gallium nitride crystal to prevent the cracking during the polishing. The yield after the polishing, which is about 80% for temperatures of not higher than 1,100° C., increases to 90% or more.

In addition, in vapor-phase deposition of the gallium nitride crystal 59 on the seed crystal substrate 57 having the mask, as shown in Part (B) of FIG. 7, a higher substrate temperature causes damaging due to accelerated decomposition of the seed crystal substrate 57 and a significant decrease in the growth rate of the gallium nitride crystal 59. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate depending upon the difference between the formation rate and the decomposition rate. If the temperature exceeds 1,300° C., the growth rate will not be higher than 10 μm/h. Thus, if the growth temperature $T_G$ is 1,300° C. or lower, a thick film of the gallium nitride crystal 59 can be formed within a practical period of time with less damage to the seed crystal substrate 57.

In another embodiment, the growth temperature $T_G$ is preferably higher than 1,150° C. This reduces the full width at half maximum of an X-ray rocking curve XRD (004) to about 50 seconds and also increases the yield in steps after the polishing to 95% or more. The growth temperature $T_G$ is preferably 1,250° C. or lower. At a growth temperature exceeding 1,250° C., the seed crystal substrate decomposes to some extent, though not so significantly, even though the temperature does not exceed 1,300° C. This precludes growth to form a thick film for a long time and limits the growth rate of the gallium nitride crystal to a certain level, resulting in cost disadvantage. Accordingly, the growth temperature is preferably 1,250° C. or lower. A temperature of 1,250° C. or lower facilitates the thick film growth and can increase the growth rate to 30 μm/h or more, so that a thicker film of the gallium nitride crystal 59 can be formed within a more practical period of time. If the gallium nitride crystal 59 is grown below the growth temperature according to the present invention, on the other hand, the mask significantly affects the crystal growth; the gallium nitride crystal grown over the mask has low crystallinity because the mask is composed of a different material.

The gallium nitride crystal provided in this embodiment has improved crystal quality because the high-temperature growth prevents new dislocations from occurring and provides high crystallinity. Also, the gallium nitride crystal has resistance to cracking during polishing of sliced pieces.

In addition, the second areas 23a preferably have a surface roughness of 10 μm or less in terms of arithmetic average roughness Ra. In this case, cracking of the gallium nitride crystal 59, presumably due to the surface roughness of the seed crystal substrate 57, can be prevented, so that the gallium nitride crystal 59 can be reliably grown.

More preferably, the second areas 23a have a surface roughness of 1 μm or less in terms of arithmetic average roughness Ra. In this case, cracking of the gallium nitride crystal 59, presumably due to the surface roughness of the seed crystal substrate 57, can be prevented more effectively, so that the gallium nitride crystal 59 can be more reliably grown.

For the crystal growth, for example, the growth furnace applicable to hydride vapor-phase epitaxy which is shown in FIG. 5 is used, as in the first embodiment.

In Step S104 of FIG. 6, subsequently, a gallium nitride crystal 63 is separated from the integrated piece of the gallium nitride crystal 59 and the seed crystal substrate 57, as shown in Part (B) of FIG. 8. The gallium nitride crystal 63 can be separated by the same method as used in the first embodiment. In Step S105 of FIG. 6, subsequently, a gallium nitride wafer is formed from the separated gallium nitride crystal 63. The separated gallium nitride crystal 63 is sliced into a predetermined thickness and is mirror-polished. A damaged layer formed during the polishing is removed to complete the gallium nitride wafer.

According to this method, a free-standing gallium nitride wafer is prepared from the separated gallium nitride crystal. Thus, a gallium nitride wafer as shown in Part (B) of FIG. 1 is completed. A gallium nitride wafer Wafer according to this embodiment is a single-crystal gallium nitride wafer including no dislocation-concentrated regions or inverted regions. The maximum dislocation density in a primary surface of the gallium nitride wafer Wafer is lower than a first dislocation density. The maximum dislocation density in a primary surface of the gallium nitride wafer Wafer is lower than a first dislocation density. The dislocation density in the primary surface of the gallium nitride wafer Wafer is $1 \times 10^6$ cm$^{-2}$ or less. In addition, the gallium nitride wafer has a size of an area of 1 cm$^2$ or more. The full width at half maximum of an X-ray rocking curve (XRD) falls below 100 seconds.

The method used for the gallium nitride substrate 11a according to the embodiment described above can also be used for a gallium nitride substrate having no or little difference in dislocation density between the first regions 17a and the second regions 19a, for example, a gallium nitride substrate including inverted-polarity regions where no dislocations are concentrated. This method can make a low-dislocation-density gallium nitride crystal or gallium nitride substrate which does not inherit inverted regions and in which no dislocations occur over the inverted regions, and can make crystals in high slicing yield.

The above gallium nitride wafer is used to fabricate an epitaxial substrate. The epitaxial substrate includes one or more gallium nitride semiconductor films provided on the gallium nitride wafer. The gallium nitride wafer can be used as a substrate of, for example, optical devices (such as light-emitting diodes and laser diodes), electronic devices (such as rectifiers, bipolar transistors, field-effect transistors, and HEMTs), semiconductor sensors (such as temperature sensors, pressure sensors, radiation sensors, and visible/ultraviolet light detectors), SAW devices, vibrators, resonators, oscillators, MEMS components, and piezoelectric actuators.

Example 5

A gallium nitride substrate similar to that used in Example 1 was prepared. A silicon nitride mask was formed by photolithography and etching. This mask covered dislocation-concentrated regions of the gallium nitride substrate. Subsequently, a gallium nitride crystal was grown under the same conditions as those used in Example 1. The surface of the resultant gallium nitride crystal was etched with a KOH—NaOH mixed melt at 350° C. The dislocation density was evaluated by counting the number of etch pits on the etched surface; they appear at positions corresponding to dislocations. The dislocation density was $5 \times 10^5$ cm$^{-2}$, meaning that a low-dislocation-density gallium nitride crystal was grown. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, the observation of the surface of the gallium nitride shows that recesses corresponding to inverted-polarity regions were not formed, meaning that a crystal containing no inverted phase was grown.

Example 6

A gallium nitride crystal was grown under the same conditions as those used in Example 5 except that the crystal was grown into a thickness of 10 mm. The resultant gallium nitride crystal was sliced in a direction parallel to the surface of the seed-crystal substrate, and was mirror-polished, thus preparing ten gallium nitride crystal substrates with a thickness of 400 μm. None of the ten substrates was cracked during the polishing; the polishing yield was 100%. One of the ten substrates was picked out and etched with a KOH—NaOH mixed melt at 350° C. The dislocation density was evaluated by counting the number of etch pits on the etched surface; they appear at positions corresponding to dislocations. The dislocation density was $5 \times 10^5$ cm$^{-2}$, meaning that a low-dislocation-density gallium nitride crystal was grown. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, the observation of the surface of the gallium nitride shows that recesses corresponding to inverted-polarity regions were not formed, meaning that a crystal containing no inverted phase was grown.

According to this embodiment, a gallium nitride crystal with low dislocation density, high crystallinity, and resistance to cracking during polishing of the sliced pieces slicing is provided because the gallium nitride crystal is grown at high temperature.

Third Embodiment

Figure 9:
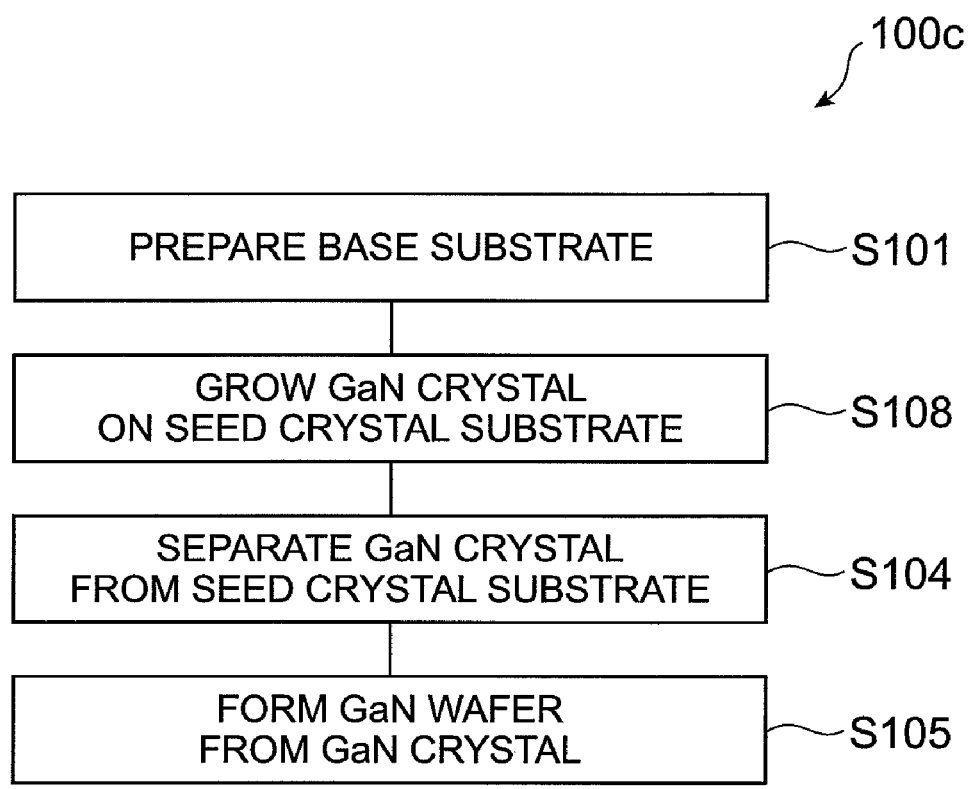
FIG. 9 is a flowchart illustrating a method for fabricating a gallium nitride crystal according to a third embodiment.

With reference to FIG. 9, a method for fabricating a gallium nitride crystal according to this embodiment will now be described. FIG. 9 shows a process flow 100c. Part (A) of FIG. 2 is a diagram illustrating a gallium nitride substrate. In Step S101, a gallium nitride substrate 11 is prepared. As in the first embodiment, the gallium nitride substrate 11 used may be either of the types shown in Parts (B) and (C) of FIG. 2. Also, in this embodiment, Parts (B) and (C) of FIG. 2 are merely illustrative of the structure of the gallium nitride substrate; the structure of the gallium nitride substrate applied to this embodiment is not limited to the specific structures shown in the drawings.

Figure 10:
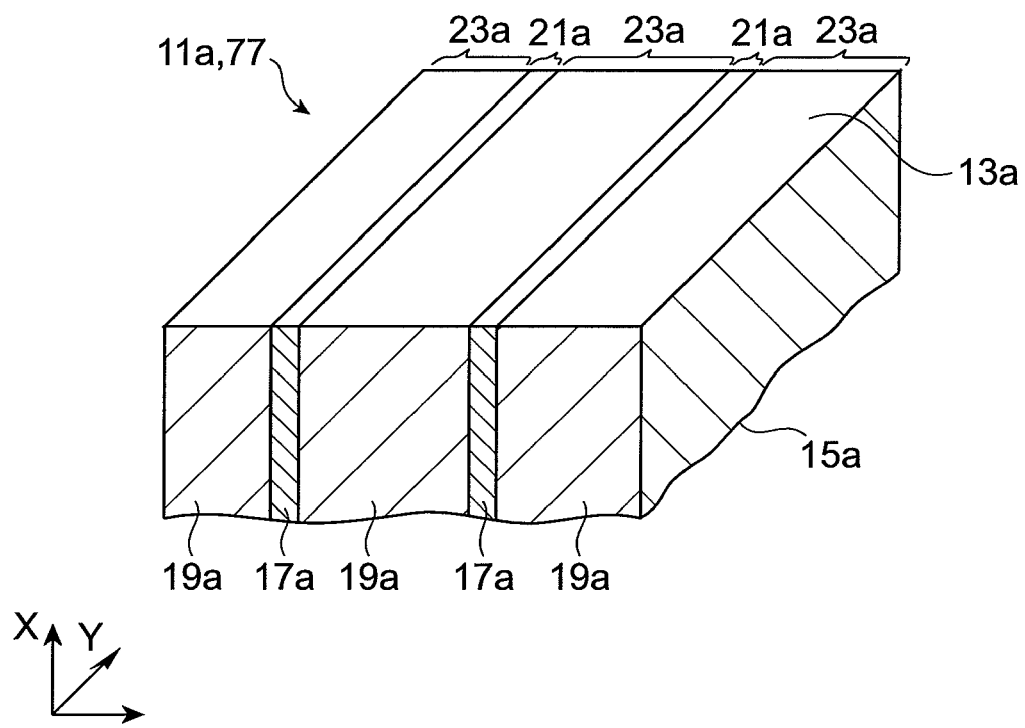
FIG. 10 is a diagram of a gallium nitride seed crystal substrate used in the method for fabricating a gallium nitride crystal according to the third embodiment.

FIG. 10 is a sectional view taken along line I-I of Part (B) of FIG. 2. A sectional view taken along line II-II of Part (C) of FIG. 2 corresponds to the sectional view taken along line I-I of Part (B) of FIG. 2. The subsequent description will focus on the gallium nitride substrate shown in Part (B) of FIG. 2.

In Step S108 of FIG. 9, a gallium nitride crystal 79 is grown on a seed crystal substrate 77 by vapor-phase deposition without forming recesses or a mask on the gallium nitride substrate 11a, as shown in Part (A) of FIG. 11. The gallium nitride crystal 79 is made of a thick film with a thickness H3 similar to, for example, the thickness H1 of the gallium nitride crystal 29. The gallium nitride crystal 79 grown on the seed crystal substrate 77 by this method is used to fabricate a free-standing gallium nitride substrate.

In the case of vapor-phase deposition of the gallium nitride crystal 79 on the seed crystal substrate 77 having no recesses or a mask, as shown in FIG. 10, the growth temperature $T_G$ is higher than 1,100° C. A temperature higher than 1,100° C. facilitates lateral growth of gallium nitride crystals on the second regions of the seed crystal substrate 77 to alleviate the effect of the first regions of the seed crystal substrate 77. This reduces the proportion of dislocations inherited from the first regions, thus reducing the dislocation density. Such a high temperature also reduces new dislocations occurring when the gallium nitride crystals grown in the lateral direction are integrated and alleviates the effect of variations in the crystal quality of the second regions. The full width at half maximum of an X-ray rocking curve XRD (004), which is at least about 100 seconds for temperatures of not higher than 1,100° C., falls below 100 seconds. Another advantage is that the grown gallium nitride crystal 79 can be prevented from being cracked during polishing after slicing, thus improving the yield after the polishing. A growth temperature higher than 1,100° C. may reduce stress-concentrated sites in the gallium nitride crystal to prevent the cracking during the polishing. The yield after the polishing, which is about 80% for temperatures of not higher than 1,100° C., increases to 90% or more.

In addition, in vapor-phase deposition of the gallium nitride crystal 79 on the seed crystal substrate 77 having no recesses or a mask, as shown in FIG. 10, the growth temperature $T_G$ is preferably 1,300° C. or lower. A higher substrate temperature $T_G$ causes damaging due to accelerated decomposition of the seed crystal substrate 77 and a significant decrease in the growth rate of the gallium nitride crystal 79. It is generally believed that raising the growth temperature increases the formation rate of a gallium nitride crystal and therefore increases its growth rate. It is assumed, however, that the decomposition rate of the gallium nitride crystal that has been formed increases more significantly than the formation rate of the gallium nitride crystal at extraordinarily high growth temperatures, thus decreasing the growth rate corresponding to the difference between the formation rate and the decomposition rate. If the temperature exceeds 1,300° C., the growth rate will not be higher than 10 µm/h. Thus, if the growth temperature $T_G$ is 1,300° C. or lower, a thick film of the gallium nitride crystal 79 can be formed within a practical period of time with less damage to the seed crystal substrate 77.

In one embodiment, the growth temperature $T_G$ is preferably higher than 1,150° C. This reduces the full width at half maximum of an X-ray rocking curve XRD (004) to about 50 seconds and also increases the yield after the polishing to 95% or more. The growth temperature $T_G$ is preferably 1,250° C. or lower. At a growth temperature exceeding 1,250° C., the seed crystal substrate decomposes to some extent, though not so significantly, even though the temperature does not exceed 1,300° C. This precludes growth to form a thick film for a long time, and limits the growth rate of the gallium nitride crystal to a certain level, resulting in cost disadvantage. Accordingly, the growth temperature is preferably 1,250° C. or lower. A temperature of 1,250° C. or lower facilitates the thick film growth and can increase the growth rate to 30 µm/h or more, so that a thicker film of the gallium nitride crystal 79 can be formed within a more practical period of time.

This method, which does not form any recesses or mask on the seed crystal substrate, is preferable to those of the first and second embodiments because it can omit a surface-processing step for forming recesses or a mask as well as prevent new dislocations from occurring due to surface irregularities on the seed crystal substrate. Also, the gallium nitride crystal exhibits resistance to cracking during polishing of sliced pieces.

In addition, the seed crystal substrate 77 preferably has a surface roughness of 10 µm or less in terms of arithmetic average roughness Ra. In this case, cracking of the gallium nitride crystal 79, presumably due to the surface roughness of the seed crystal substrate 77, can be prevented, so that the gallium nitride crystal 79 can be reliably grown.

More preferably, the seed crystal substrate 77 has a surface roughness of 1 µm or less in terms of arithmetic average roughness Ra. In this case, cracking of the gallium nitride crystal 79, presumably due to the surface roughness of the seed crystal substrate 77, can be prevented more effectively, so that the gallium nitride crystal 79 can be more reliably grown.

For the crystal growth, for example, the growth furnace applicable to hydride vapor-phase epitaxy which is shown in FIG. 5 is used, as in the first embodiment.

In Step S104 of FIG. 9, subsequently, a gallium nitride crystal 83 is separated from the integrated piece of the gallium nitride crystal 79 and the seed crystal substrate 77. The gallium nitride crystal 83 can be separated by the same method as used in the first embodiment. In Step S105 of FIG. 9, subsequently, a gallium nitride wafer is formed from the separated gallium nitride crystal 83. The separate gallium nitride crystal 83 is sliced into a predetermined thickness, and the sliced pieces are mirror-polished. A damaged layer formed during the polishing is removed to complete the gallium nitride wafer.

According to this method, a free-standing gallium nitride wafer is prepared from the separated gallium nitride crystal. Thus, a gallium nitride wafer as shown in Part (B) of FIG. 1 is completed. A gallium nitride wafer, Wafer, according to this embodiment is made of a single-crystal gallium nitride including neither dislocation-concentrated regions nor inverted-polarity regions. The maximum dislocation density in a primary surface of the gallium nitride wafer, Wafer, is lower than a first dislocation density. The maximum dislocation density in a primary surface of the gallium nitride wafer, Wafer, is lower than a first dislocation density. The dislocation density in the primary surface of the gallium nitride wafer Wafer is $1 \times 10^6$ cm$^{-2}$ or less. In addition, the gallium nitride wafer has a size of an area of 1 cm$^2$ or more. The full width at half maximum of an X-ray rocking curve (XRD) falls below 100 seconds.

The above gallium nitride wafer is used to fabricate an epitaxial substrate. The epitaxial substrate includes one or more gallium nitride semiconductor films provided on the gallium nitride wafer. The gallium nitride wafer can be used as a substrate of, for example, optical devices (such as light-emitting diodes and laser diodes), electronic devices (such as rectifiers, bipolar transistors, field-effect transistors, and HEMTs), semiconductor sensors (such as temperature sensors, pressure sensors, radiation sensors, and visible/ultraviolet light detectors), SAW devices, vibrators, resonators, oscillators, MEMS components, and piezoelectric actuators.

Example 7

In a growth furnace capable of locally heating a gallium nitride substrate, as shown in FIG. 5, a gallium nitride crystal was grown by HVPE. The gallium nitride substrate was prepared such that the growth surface was not planar but had three-dimensional growth pits defined by facets and composites thereof and such that the crystal was facet-grown without filling these pits and the composites, whereby dislocations were concentrated in the above pits and the composites. Accordingly, the gallium nitride substrate had dislocation-concentrated regions. The gallium nitride substrate had a size of 2 inches and a thickness of 400 µm, and its primary surface was the (0001) plane. The gallium nitride substrate, serving as a seed crystal substrate, was placed on a stage of a support in a reaction tube. The substrate temperature was set to 1,200° C. Gallium chloride was produced by heating a gallium boat filled with gallium to 800° C. while supplying HCl gas and $H_2$ gas. A gallium nitride crystal was grown into a thickness of 400 µm on the seed crystal substrate by supplying the gallium chloride gas and ammonia gas. The partial pressures of HCl and $NH_3$ were adjusted such that the growth rate reached 50 µm/h or more without polycrystal formation. A crystal quality analysis of the resulting gallium nitride crystal by X-ray diffractometry (XRD) showed that the full width at half maximum of a rocking curve for the (004) plane was 30 seconds, which is an excellent level. Then, the surface of the formed gallium nitride crystal was etched with a KOH—NaOH mixed melt at 350° C. The dislocation density was evaluated by counting the number of etch pits on the etched surface; they appear at positions corresponding to dislocations. The dislocation density was $1 \times 10^5$ cm$^{-2}$, meaning that a low-dislocation-density gallium nitride crystal was grown.

Example 8

A gallium nitride crystal was grown under the same conditions as those used in Example 7 except that the crystal was grown into a thickness of 10 mm. The resultant gallium nitride crystal was sliced in a direction parallel to the surface of the seed-crystal substrate and was mirror-polished, thus preparing ten gallium nitride crystal substrates with a thickness of 400 µm. None of the ten substrates was cracked during the polishing; the polishing yield was 100%. One of the ten substrates was picked out and etched with a KOH—NaOH mixed melt at 350° C. The dislocation density was evaluated by counting the number of etch pits on the etched surface; they appear at positions corresponding to dislocations. The dislocation density was $1 \times 10^5$ cm$^{-2}$, meaning that a low-dislocation-density gallium nitride crystal was grown. A crystal quality analysis of the gallium nitride crystal by X-ray diffractometry (XRD) showed that the full width at half maximum of a rocking curve for the (004) plane was 30 seconds, which is an excellent level.

According to this embodiment, a gallium nitride crystal with less dislocation density, high crystallinity, and resistance to cracking during polishing after slicing is provided because the gallium nitride crystal is grown at high temperature without forming recesses or a mask on the seed crystal substrate.

The embodiments according to the present invention are not limited to the specific embodiments that have been described. In addition to the embodiments that have been described, an additional embodiment according to the present invention will be further described. Also, in the additional embodiment, a gallium nitride substrate including first and second regions is used, and a primary surface of the gallium nitride substrate includes first and second areas. A seed crystal substrate is prepared by forming recesses in the first areas on the gallium nitride substrate and forming a mask over the recesses. Gallium nitride can also be grown on the seed crystal substrate. This method enables crystal growth under such growth conditions (source gas conditions) that the first areas are not inherited. For example, a crystal that does not inherit the first areas can be grown under such source gas conditions that the growth rate reaches 200 µm/h or more. This method has a cost advantage with increased throughput as compared to the method in which either recesses or a mask is used or the method in which no recesses or mask is formed.

In the embodiments that have been described, prolonged crystal growth on a seed crystal substrate is not easy at a substrate temperature higher than 1,250° C. and equal to or lower than 1,300° C. due to damage to the seed crystal substrate, and it can also result in a decrease in growth rate due to an increase in decomposition rate. The method according to the additional embodiment, in contrast, causes no decrease in growth rate in the above temperature range because a crystal that does not inherit the first areas can be grown even if the partial pressures of the source gases are increased in order to increase the formation rate against the increased decomposition rate.

Example 9

FIG. 12 includes diagrams illustrating main steps of preparing the seed crystal substrate according to the additional embodiment. Referring to Part (A) of FIG. 12, a gallium nitride substrate 85 of the same type as used in Example 1 was prepared. The gallium nitride substrate 85 included first regions 85a and second regions 85b that were alternately arranged. When the gallium nitride substrate 85 was etched with a melt containing potassium hydroxide, the inverted-polarity regions 85a of the gallium nitride substrate 85 (the surfaces of the inverted regions 85a correspond to the first areas) were selectively etched, whereby recesses (for example, grooves) 87 corresponding to the inverted-phase regions 85a were formed, as shown in Part (B) of FIG. 12. Referring then to Part (C) of FIG. 12, a mask film 89 is formed over the entire primary surface of the gallium nitride substrate 85. The mask film 89 used can be made of an insulating material such as a $SiO_2$ film. The mask film 89 included first portions 89a formed in the second areas, corresponding to the surfaces of the uninverted-polarity regions 85b, second portions 89b formed on side surfaces 87a of the recesses 87, and third portions 89c formed on bottom surfaces 87b of the recesses 87. After the mask film 89 was grown, the gallium nitride substrate 11a and the mask film 89a were polished to remove the mask film 89a from the portions other than the recesses, as shown in Part (D) of FIG. 12. As a result, the first portions 89a of the mask film 89 disappeared, the second portions 89b remained on the side surfaces 87a of the recesses 87, and the third portions 89c remained on the bottom surfaces 87b of the recesses 87. After the polishing, a damaged layer on the surface of the gallium nitride substrate was removed to prepare a seed crystal substrate 91. Referring to Part (E) of FIG. 12, the seed crystal substrate 91 included recesses 93 corresponding to the inverted-phase regions and covered with the mask film 89 and polished second areas 91a.

The inverted-polarity regions 85a can provide an N-plane on the primary surface, whereas the uninverted-polarity regions 85b can provide a Ga-plane on the primary surface. Alternatively, the inverted-polarity regions 85a may have a higher dislocation density than the uninverted-polarity regions 85b.

The inverted-polarity regions 85a can provide an N-plane on the primary surface, whereas the uninverted-polarity regions 85b can provide a Ga-plane on the primary surface. Alternatively, the inverted-polarity regions 85a may have a higher dislocation density than the uninverted-polarity regions 85b.

Subsequently, a gallium nitride crystal was grown. The growth conditions used were the same as those used in Example 1 except that the partial pressures of HCl and $NH_3$ were adjusted such that the growth rate reached 200 µm/h or more without polycrystal formation. The surface of the resultant gallium nitride crystal was etched with a KOH—NaOH mixed melt at 350° C. The dislocation density was evaluated by counting the number of etch pits on the etched surface; they appear at positions corresponding to dislocations. The dislocation density was $5 \times 10^5$ cm$^{-2}$, meaning that a low-dislocation-density gallium nitride crystal was grown. A crystal quality analysis of the gallium nitride crystal by X-ray diffractometry (XRD) showed that the full width at half maximum of a rocking curve for the (004) plane was 50 seconds, which is an excellent level. When the gallium nitride crystal was immersed in a melt containing potassium hydroxide, the observation of the etched surface showed that no recesses corresponding to inverted-polarity regions were formed, meaning that a crystal containing no inverted phase was grown.

While the principle of the present invention has been described in the preferred embodiments with reference to the drawings, it will be appreciated by those skilled in the art that the arrangements and details of the invention can be changed without departing from its principle. The present invention is not limited to the specific structures disclosed in the embodiments. Hence, all modifications and changes resulting from the scope of the claims and their spirits are claimed.

INDUSTRIAL APPLICABILITY

The present invention can provide a method for fabricating a gallium nitride crystal with low dislocation density, high crystallinity, and resistance to cracking during polishing after slicing by growing the gallium nitride crystal on a seed crystal substrate including dislocation-concentrated regions or inverted regions.

The invention claimed is:

1. A method for fabricating a gallium nitride crystal, comprising the steps of:
   preparing a gallium nitride substrate including a plurality of first regions, a second region, and a primary surface, each first region having a dislocation density higher than a first dislocation density, the second region having a dislocation density lower than the first dislocation density, a primary surface including first areas and a second area, the first regions being exposed in the first areas, and the second region being exposed in the second area; and
   growing a gallium nitride crystal using the gallium nitride substrate as a seed crystal substrate by vapor-phase deposition at a growth temperature higher than 1,100° C. and equal to or lower than 1,300° C. without using recesses or a mask in the first areas,
   wherein when masks and/or recesses are formed on a first region in the substrate, the crystal grown on the substrate does not include any inverted-polarity region.

2. A method for fabricating a gallium nitride crystal, comprising the steps of:
   preparing a gallium nitride substrate including a plurality of first regions, a second region, and a primary surface, each first region comprising single-crystal gallium nitride, the second region comprising single-crystal gallium nitride, a crystal axis of the single-crystal gallium nitride of the second region being opposite in orientation to that of the single-crystal gallium nitride in the first regions, and the first regions being exposed in the first areas, and the second region being exposed in the second area;
   forming recesses in the first areas to prepare a seed crystal substrate; and
   growing a gallium nitride crystal on the seed crystal substrate and over the recesses by one of liquid-phase deposition and vapor-phase deposition to form voids from the recesses,
   wherein when the recesses are formed on a first region in the substrate, the crystal grown on the substrate does not include any inverted-polarity region.

3. A method for fabricating a gallium nitride crystal, comprising the steps of:
   preparing a gallium nitride substrate including first regions, a second region, and a primary surface, the first regions comprising single-crystal gallium nitride, the second region comprising single-crystal gallium nitride, a crystal axis of the single-crystal gallium nitride of the first regions being opposite in orientation to that of the single-crystal gallium nitride in the first regions, the first regions being exposed in the first areas, and the second region being exposed in the second area;
   forming recesses in the first areas to prepare a seed crystal substrate; and
   growing a gallium nitride crystal on the seed crystal substrate by vapor-phase deposition at a growth temperature higher than 1,100° C. and equal to or lower than 1,300° C.,
   wherein when the recesses are formed on a first region in the substrate, the crystal grown on the substrate does not include any inverted-polarity region.

4. The method according to claim 3, wherein the growth temperature is higher than 1,150° C. and equal to or lower than 1,250° C.

5. A method for fabricating a gallium nitride crystal, comprising the steps of:
   preparing a gallium nitride substrate including first regions, a second region, and a primary surface, the first regions comprising single-crystal gallium nitride, the second region comprising single-crystal gallium nitride, a crystal axis of the single-crystal gallium nitride being opposite in orientation to that of the single-crystal gallium nitride in the first regions, the primary surface including first areas and a second area, the first regions being exposed in the first areas, and the second region being exposed in the second area;
   forming a mask so as to cover the first areas to prepare a seed crystal substrate; and
   growing gallium nitride on the seed crystal substrate by liquid-phase deposition or vapor-phase deposition so as to embed the mask,
   wherein when the mask is formed on a first region in the substrate, a crystal grown on the substrate does not include any inverted-polarity region.

6. A method for fabricating a gallium nitride crystal, comprising the steps of:
   preparing a gallium nitride substrate including first regions, a second region, and a primary surface, the first regions comprising single-crystal gallium nitride, the second region comprising single-crystal gallium nitride, a crystal axis of the single-crystal gallium nitride of first regions being opposite in orientation to that of the single-crystal gallium nitride in the first regions, and the first regions being exposed in the first areas, and the second region being exposed in the second area;
   forming a mask so as to cover the first areas to prepare a seed crystal substrate; and
   growing a gallium nitride crystal on the seed crystal substrate by vapor-phase deposition at a growth temperature higher than 1,100° C. and equal to or lower than 1,300° C. to form a gallium nitride crystal thicker than the mask, wherein when the mask is formed on a first region in the substrate, the crystal grown on the substrate does not include any inverted-polarity region.

7. The method according to claim 6, wherein the growth temperature is higher than 1,150° C. and equal to or lower than 1,250° C.

8. A method for fabricating a gallium nitride crystal, comprising the steps of:
preparing a gallium nitride substrate including first regions, a second region, and a primary surface, the first regions comprising single-crystal gallium nitride, the second region comprising single-crystal gallium nitride, a crystal axis of the single-crystal gallium nitride being opposite in orientation to that of the single-crystal gallium nitride in the first regions, the first regions being exposed in the first areas, and the second region being exposed in the second area;
forming recesses in the first areas and a mask over the recesses in the first areas to prepare a seed crystal substrate; and
growing a gallium nitride crystal on the seed crystal substrate by liquid-phase deposition or vapor-phase deposition such that voids corresponding to the recesses are formed,
wherein when the recesses are formed on a first region in the substrate, the crystal grown on the substrate does not include any inverted-polarity region.

9. A method for fabricating a gallium nitride crystal, comprising the steps of:
preparing a gallium nitride substrate including first regions, a second region, and a primary surface, the first regions comprising single-crystal gallium nitride, the second region comprising single-crystal gallium nitride, a crystal axis of the single-crystal gallium nitride being opposite in orientation to that of the single-crystal gallium nitride in the first regions, the first regions being exposed in the first areas, and the second region being exposed in the second area;
forming recesses in the first areas and a mask over the recesses in the first areas to prepare a seed crystal substrate; and
growing a gallium nitride crystal on the seed crystal substrate by vapor-phase deposition at a growth temperature higher than 1,100° C. and equal to or lower than 1,300° C.,
wherein when the mask and/or recesses is formed on a first region in the substrate, the crystal grown on the substrate does not include any inverted-polarity region.

10. The method according to claim 9, wherein the growth temperature is higher than 1,150° C. and equal to or lower than 1,250° C.

11. The method according to claim 8, wherein the second area of the seed crystal substrate has a surface roughness of 10 µM or less in terms of arithmetic average roughness Ra.

12. The method according to claim 8, wherein the second area of the seed crystal substrate has a surface roughness of 1 µm or less in terms of arithmetic average roughness Ra.

13. The method according to claim 8, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with at least one of HCl, $Cl_2$, $BCl_3$, and $CCl_4$.

14. The method according to claim 8, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with a solution containing at least one of phosphoric acid, nitric acid, and sulfuric acid.

15. The method according to claim 8, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with a solution containing at least one of potassium hydroxide and sodium hydroxide.

16. The method according to claim 8, wherein the mask comprises at least one of silicon oxide and silicon nitride.

17. The method according to claim 8, wherein the seed crystal substrate is a free-standing gallium nitride substrate with a thickness of 100 µm or more.

18. The method according to claim 9, wherein the second area of the seed crystal substrate has a surface roughness of 10 µm or less in terms of arithmetic average roughness Ra.

19. The method according to claim 9, wherein the second area of the seed crystal substrate has a surface roughness of 1 µm or less in terms of arithmetic average roughness Ra.

20. The method according to claim 9, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with at least one of HCl, $Cl_2$, $BCl_3$, and $CCl_4$.

21. The method according to claim 9, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with a solution containing at least one of phosphoric acid, nitric acid, and sulfuric acid.

22. The method according to claim 9, wherein
the N-plane of the single-crystal gallium nitride appears on the first areas;
the recesses are formed by etching the primary surface of the gallium nitride substrate in the step of forming the recesses in the first areas and the mask over the recesses in the first areas to prepare the seed crystal substrate; and
the etching is performed with a solution containing at least one of potassium hydroxide and sodium hydroxide.

23. The method according to claim 9, wherein the mask comprises at least one of silicon oxide and silicon nitride.

24. The method according to claim 9, wherein the seed crystal substrate is a free-standing gallium nitride substrate with a thickness of 100 µm or more.

25. The method according to claim 8, wherein a surface of the seed crystal substrate is the (0001) plane.

26. The method according to claim 8, wherein the gallium nitride crystal grown on the seed crystal substrate has a thickness of 200 µm or more.

27. The method according to claim 8, further comprising the steps of:
- separating the gallium nitride crystal from an integrated piece of the gallium nitride crystal and the seed crystal substrate; and
- forming a single-crystal gallium nitride wafer from the separated gallium nitride crystal.

28. The method according to claim 9, wherein a surface of the seed crystal substrate is the (0001) plane.

29. The method according to claim 9, wherein the gallium nitride crystal grown on the seed crystal substrate has a thickness of 200 μm or more.

30. The method according to claim 9, further comprising the steps of:
- separating the gallium nitride crystal from an integrated piece of the gallium nitride crystal and the seed crystal substrate; and
- forming a single-crystal gallium nitride wafer from the separated gallium nitride crystal.

31. A method for fabricating a gallium nitride crystal, comprising the steps of:
- preparing a gallium nitride substrate including a plurality of first regions, a second region and a primary surface, each first regions having a dislocation density higher than a first dislocation density, the second region having a dislocation density lower than the first dislocation density, the primary surface including first areas and a second area, the first regions being exposed in the first areas and the second region being exposed in the second area;
- forming recesses in the first areas to prepare a seed crystal substrate; and
- growing a gallium nitride crystal over the recesses and on the seed crystal substrate by one of liquid-phase deposition and vapor-phase deposition to form voids from the recesses,
- wherein when the recesses are formed on a first region in the substrate, the crystal does not include any inverted-polarity region.

32. A method for fabricating a gallium nitride crystal, comprising the steps of:
- preparing a gallium nitride substrate including a plurality of first regions, a second region, and a primary surface, each first region having a dislocation density higher than a first dislocation density, the second region having a dislocation density lower than the first dislocation density, the primary surface including first areas and a second area, the first regions being exposed in the first areas, and the second region being exposed in the second area;
- forming recesses in the first areas to prepare a seed crystal substrate; and
- growing a gallium nitride crystal on the seed crystal substrate by vapor-phase deposition at a growth temperature higher than 1,100° C. and equal to or lower than 1,300° C.,
- wherein when the recesses are formed on a first region in the substrate, the crystal does not include any inverted-polarity region.

33. The method according to claim 32, wherein the growth temperature is higher than 1,150° C. and equal to or lower than 1,250° C.

34. A method for fabricating a gallium nitride crystal, comprising the steps of:
- preparing a gallium nitride substrate including a plurality of first regions, a second region, and a primary surface, each first region having a dislocation density higher than a first dislocation density, the second region having a dislocation density lower than the first dislocation density, and the primary surface including first areas and a second area, the first regions being exposed in the first areas, and the second region being exposed in the second area;
- forming a mask so as to cover the first areas to prepare a seed crystal substrate; and
- growing gallium nitride on the seed crystal substrate by one of liquid-phase deposition and vapor-phase deposition so as to embed the mask,
- wherein when the mask is formed on a first region in the substrate, a crystal grown on the substrate does not include any inverted-polarity region.

35. A method for fabricating a gallium nitride crystal, comprising the steps of:
- preparing a gallium nitride substrate including a plurality of first regions, a second region, and a primary surface, each first regions having a dislocation density higher than a first dislocation density, the second region having a dislocation density lower than the first dislocation density, the primary surface including first areas and a second area, the first regions being exposed in the first areas and the second region being exposed in the second area;
- forming a mask so as to cover the first areas to prepare a seed crystal substrate; and
- growing a gallium nitride crystal on the seed crystal substrate by vapor-phase deposition at a growth temperature higher than 1,100° C. and equal to or lower than 1,300° C. to form a gallium nitride crystal thicker than the mask,
- wherein when the mask is formed on a first region in the substrate, a crystal grown on the substrate does not include any inverted-polarity region.

36. The method according to claim 35, wherein the growth temperature is higher than 1,150° C. and equal to or lower than 1,250° C.

37. A method for fabricating a gallium nitride crystal, comprising the steps of:
- preparing a gallium nitride substrate including a plurality of first regions, a second region, and a primary surface, each first regions having a dislocation density higher than a first dislocation density, the second region having a dislocation density lower than the first dislocation density, the primary surface including first areas and a second area, the first regions being exposed in the first areas, and the second region being exposed in the second area;
- forming recesses in the first areas and a mask over the recesses in the first areas to prepare a seed crystal substrate; and
- growing a gallium nitride crystal on the seed crystal substrate and over the recesses by one of liquid-phase deposition and vapor-phase deposition to form voids from the recesses,
- wherein when the mask and/or recesses is formed on a first region in the substrate, a crystal grown on the substrate does not include any inverted-polarity region.

38. A method for fabricating a gallium nitride crystal, comprising the steps of:
- preparing a gallium nitride substrate including a plurality of first regions, a second region, and a primary surface, each first region having a dislocation density higher than a first dislocation density, the second region having a dislocation density lower than the first dislocation density, the primary surface including first areas and a second area, the second region being exposed in first areas, and the second region being exposed in the second area;

forming recesses in the first areas and a mask over the recesses in the first areas to prepare a seed crystal substrate; and growing a gallium nitride crystal on the seed crystal substrate by vapor-phase deposition at a growth temperature higher than 1,100° C. and equal to or lower than 1,300° C., wherein when the mask and/or recesses is formed on a first region in the substrate, the crystal grown on the substrate does not include any inverted-polarity region.

39. The method according to claim 38, wherein the growth temperature is higher than 1,150° C. and equal to or lower than 1,250° C.

40. The method according to claim 1, wherein the growth temperature is higher than 1,150° C. and equal to or lower than 1,250° C.

* * * * *